(12) United States Patent
Park

(10) Patent No.: US 12,532,649 B2
(45) Date of Patent: Jan. 20, 2026

(54) ELECTRONIC APPARATUS AND METHOD OF MANUFACTURING THE SAME

(71) Applicant: Samsung Display Co., Ltd., Yongin-si (KR)

(72) Inventor: Gyeongsang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 462 days.

(21) Appl. No.: 18/302,862

(22) Filed: Apr. 19, 2023

(65) Prior Publication Data

US 2023/0403914 A1 Dec. 14, 2023

(30) Foreign Application Priority Data

Jun. 10, 2022 (KR) .................. 10-2022-0071010

(51) Int. Cl.
*H10K 59/80* (2023.01)
*H10K 59/65* (2023.01)
*H10K 71/13* (2023.01)

(52) U.S. Cl.
CPC ......... *H10K 59/8792* (2023.02); *H10K 59/65* (2023.02); *H10K 71/135* (2023.02)

(58) Field of Classification Search
CPC ... H10K 59/8792; H10K 59/65; H10K 71/135
See application file for complete search history.

(56) References Cited

U.S. PATENT DOCUMENTS

| 11,333,915 B2* | 5/2022 | Yu .................. H04M 1/0264 |
| 2020/0166970 A1* | 5/2020 | Yeom .................. G06F 1/1652 |
| 2022/0221638 A1* | 7/2022 | Seo .................. G06F 1/1686 |

FOREIGN PATENT DOCUMENTS

KR 10-0872162 12/2008

* cited by examiner

*Primary Examiner* — Anne M Hines
(74) *Attorney, Agent, or Firm* — Sughrue Mion, PLLC

(57) ABSTRACT

An electronic apparatus including a window including a bezel region including a semi-transmission region and a non-transmission region surrounding the semi-transmission region, and a transmission region adjacent to the bezel region, and a display panel disposed under the window. The window includes a base substrate, a light blocking pattern overlapping the non-transmission region, and an ink layer overlapping the semi-transmission region. The ink layer includes a first ink layer disposed under the base substrate, and a second ink layer disposed under the first ink layer, having a density lower than that of the first ink layer, and having a light transmittance of about 90% or more in a wavelength range of about 540 nm.

20 Claims, 13 Drawing Sheets

ELECTRONIC APPARATUS AND METHOD OF MANUFACTURING THE SAME

CROSS-REFERENCE TO RELATED APPLICATION(S)

This application claims priority to and benefits of Korean Patent Application No. 10-2022-0071010 under 35 U.S.C. § 119, filed on Jun. 10, 2022 in the Korean Intellectual Property Office (KIPO), the entire contents of which are hereby incorporated by reference.

BACKGROUND

1. Technical Field

The disclosure relates to an electronic apparatus including a semi-transmission region through which an optical signal is transmitted, and a method of manufacturing the same.

2. Description of the Related Art

In case that a defect occurs during an electronic apparatus manufacturing process, a rework process may be required to reduce costs. The rework process may include a process of removing an adhesive layer disposed on a window in order to bond a window and a display panel to each other, and for this purpose, a physical or chemical treatment may be performed on the surface of the window. This may cause a problem such as damage or smearing of ink printed on the window.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic apparatus having improved durability and chemical resistance. The disclosure also provides a method of manufacturing an electronic apparatus having improved process reliability and productivity.

An embodiment may include an electronic apparatus including a window including a bezel region including a semi-transmission region and a non-transmission region surrounding the semi-transmission region, and a transmission region adjacent to the bezel region, and a display panel disposed under the window. The window may include a base substrate, a light blocking pattern overlapping the non-transmission region, and an ink layer overlapping the semi-transmission region. The ink layer may include a first ink layer disposed under the base substrate and a second ink layer disposed under the first ink layer, having a density lower than that of the first ink layer, and having a light transmittance of about 90% or more in a wavelength range of about 540 nm.

In an embodiment, with respect to a direction extending from a center of the semi-transmission region to the non-transmission region, a first width of the first ink layer in the direction and a second width of the second ink layer in the direction may be same.

In an embodiment, the light blocking pattern may include an opening overlapping the semi-transmission region, and a third width of the opening in the direction may be smaller than the first width and the second width.

In an embodiment, the first ink layer may include a first surface parallel to a plane defined by a first direction and a second direction intersecting the first direction and a first side surface extending from the first surface and parallel to a third direction intersecting the first direction and the second direction, the second ink layer may include a second surface parallel to the plane and facing the first surface and a second side surface extending from the second surface and parallel to the third direction, and the first side surface and the second side surface may be aligned with each other.

In an embodiment, the light blocking pattern may include an opening overlapping the semi-transmission region, and the ink layer may fill the opening.

In an embodiment, the first ink layer may be in physical contact with a lower surface of the light blocking pattern, and the second ink layer may be disposed to be spaced apart from the light blocking pattern with the first ink layer interposed therebetween.

In an embodiment, the first ink layer and the second ink layer may have an integral shape.

In an embodiment, the second ink layer may include a thermosetting resin.

In an embodiment, the light transmittance of the first ink layer in a wavelength range of about 540 nm may be about 10% or less.

In an embodiment, the first ink layer may include a base resin, and a dye dispersed in the base resin.

In an embodiment, the light blocking pattern may include a first light blocking pattern disposed under the base substrate, and a second light blocking pattern disposed under the first light blocking pattern.

In an embodiment, the first light blocking pattern includes a first opening overlapping at least the semi-transmission region, and a second opening different from the first opening may be defined in the second light blocking pattern, and the ink layer may fill the first opening and the second opening.

In an embodiment, the electronic apparatus may further include an infrared detection sensor overlapping the semi-transmission region.

In an embodiment, the display panel may include a base layer, pixels disposed on the base layer and overlapping the transmission region, and an encapsulation layer disposed on the pixels.

In an embodiment, an electronic apparatus may include an electronic part to output or receive a signal, a window including a first region overlapping the electronic part, a second region surrounding at least a portion of the first region, and a third region adjacent to the second region, and a display part disposed under the window. The window may include a base substrate, a light blocking pattern including an opening overlapping at least a portion of the first region, and an ink layer overlapping the first region and filling the opening. The ink layer may include a first ink layer disposed under the base substrate and having a first width with respect to a direction extending from the center of the opening to the second region, and a second ink layer disposed under the first ink layer and having a second width equal to the first width with respect to the direction.

In an embodiment, a method for manufacturing an electronic apparatus may include preparing a base substrate including a bezel region including a semi-transmission region and a non-transmission region surrounding the semi-transmission region, and a transmission region adjacent to the bezel region, forming a light blocking pattern including an opening overlapping at least a portion of the semi-transmission region, providing an ink composition including resin particles and a first ink so as to fill the opening in order to form a printing pattern, performing a first curing of the printing pattern at a first temperature to form a preliminary ink layer, and performing a second curing of the preliminary ink layer at a second temperature higher than the first temperature.

In an embodiment, a density of the resin particles may be lower than a density of the first ink.

In an embodiment, the first temperature may be less than a melting point of the resin particles, and the second temperature may be greater than or equal to the melting point of the resin particles.

In an embodiment, in the forming of the preliminary ink layer, the resin particles may be phase-separated to an upper portion of the preliminary ink layer.

In an embodiment, the resin particles may include a thermosetting resin, and in the performing of the second curing, the resin particles may be melted and thermally cured.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
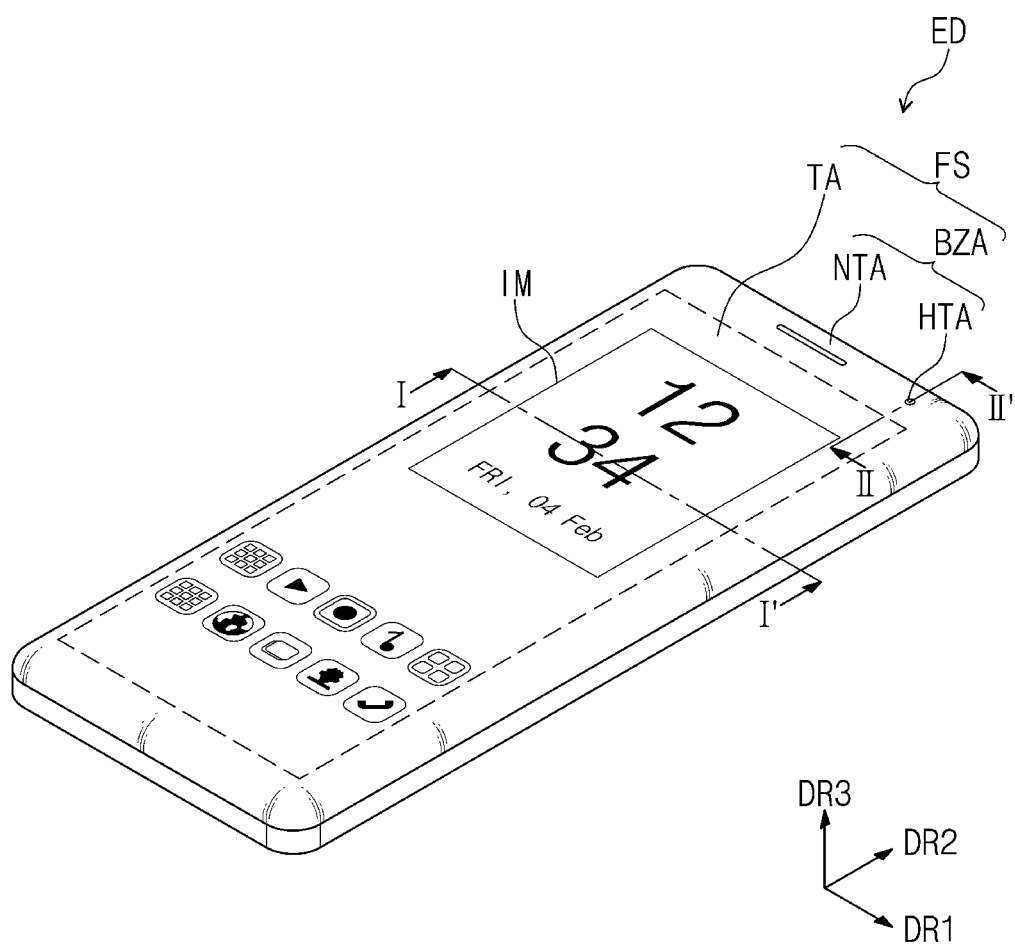
FIG. 1 is a schematic perspective view of an electronic apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, it will be understood that when an element (or region, layer, portion, etc.) is referred to as "being on", "connected to" or "coupled to" another element, it can be directly on, connected or coupled to the other element, or intervening elements may be present.

The same reference numerals or symbols refer to the same elements. In the drawings, the thicknesses, ratios, and dimensions of elements may be exaggerated for effective description of technical content.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Terms such as "first" and "second" may be used to describe various elements, but the elements should not be limited by these terms. These terms are only used for the purpose of distinguishing one element from other elements. For example, without departing from the scope of the disclosure, a first element may be referred to as a second element, and similarly, a second element may be referred to as a first element. Singular expressions include plural expressions unless the context clearly indicates otherwise.

Terms such as "under", "lower", "above", and "upper" are used to describe the relationship between elements shown in the drawings. The terms are relative concepts and are described based on the directions indicated in the drawings.

Terms such as "include" or "have" are intended to designate the presence of a feature, number, step, action, element, portion, or combination thereof described in the specification, and it should be understood that it does not preclude the possibility of presence or addition of one or more other features, numbers, steps, operations, elements, portions, or combinations thereof.

In this specification, the expression "being directly disposed" may mean that there is no layer, film, region, plate, or the like which is added between a part of a layer, film, region, plate, or the like and another part. For example, the expression "being directly disposed" may mean being disposed between two layers or two members without an additional member such as an adhesive member interposed therebetween.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art (e.g., such as due to manufacturing), considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used in this specification have the same meaning as commonly understood by one of ordinary skill in the art to which this disclosure belongs. It will be further understood that terms, such as those defined in commonly used dictionaries, should be interpreted as having a meaning that is consistent with their meaning in the context of the related technology, and should not be interpreted in an idealized or overly formal sense unless expressly so defined herein.

Figure 2:
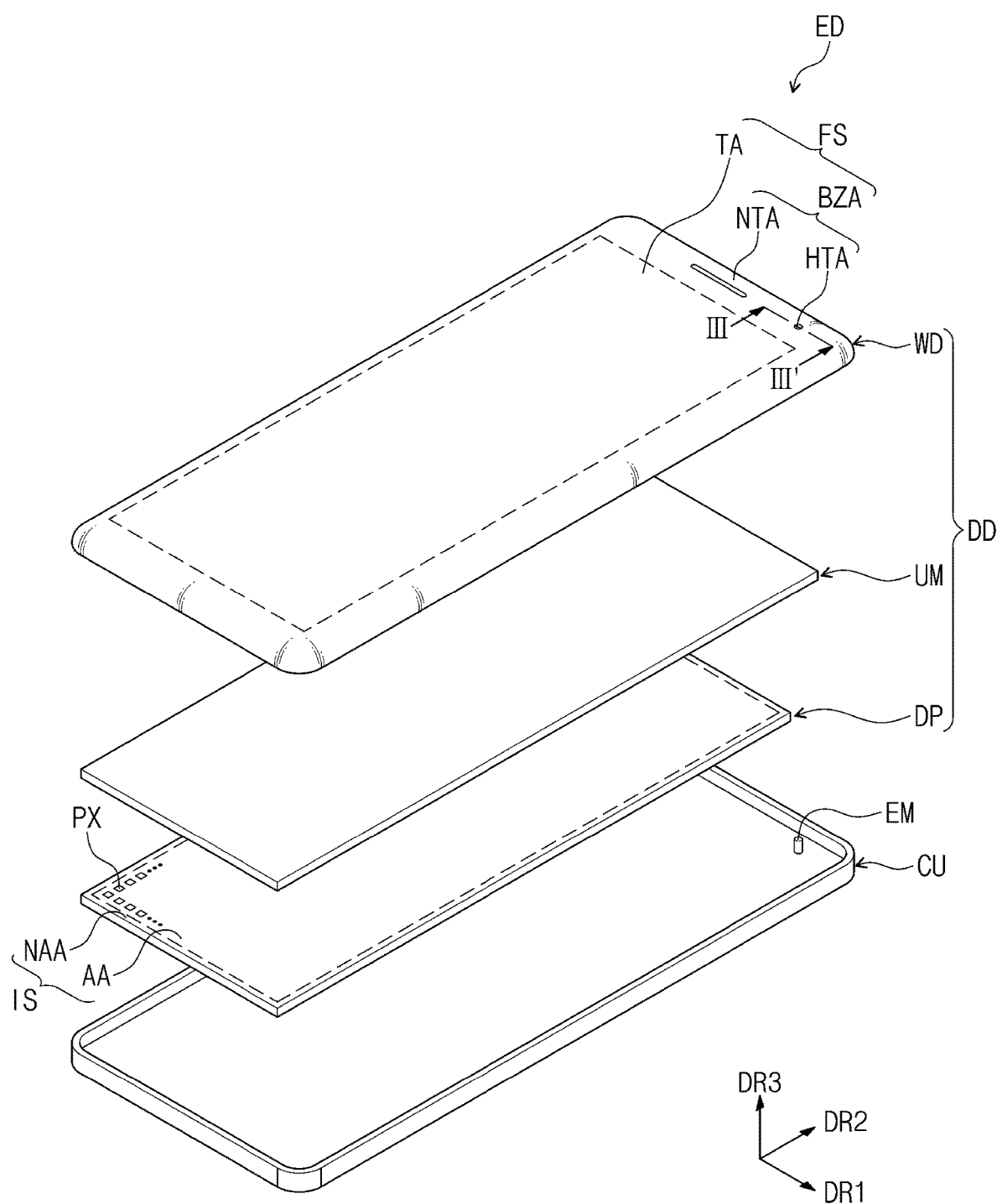
FIG. 2 is an exploded schematic perspective view of the electronic apparatus according to an embodiment.
Figure 3:
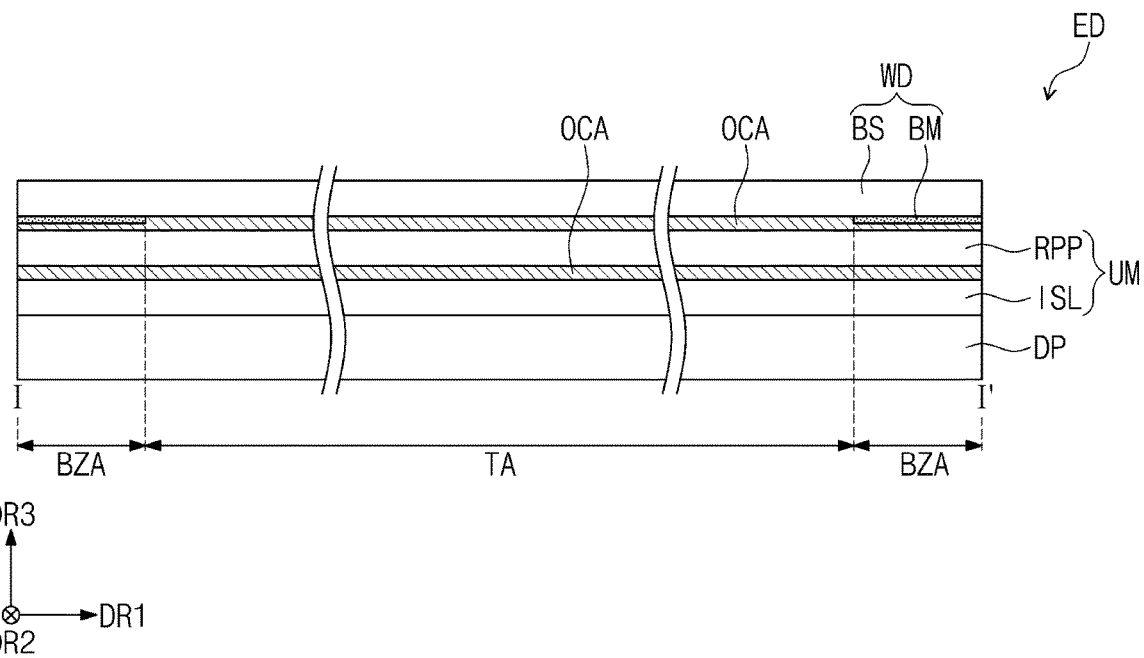
FIG. 3 is a schematic cross-sectional view of the electronic apparatus taken along line I-I' of FIG. 1.
Figure 4:
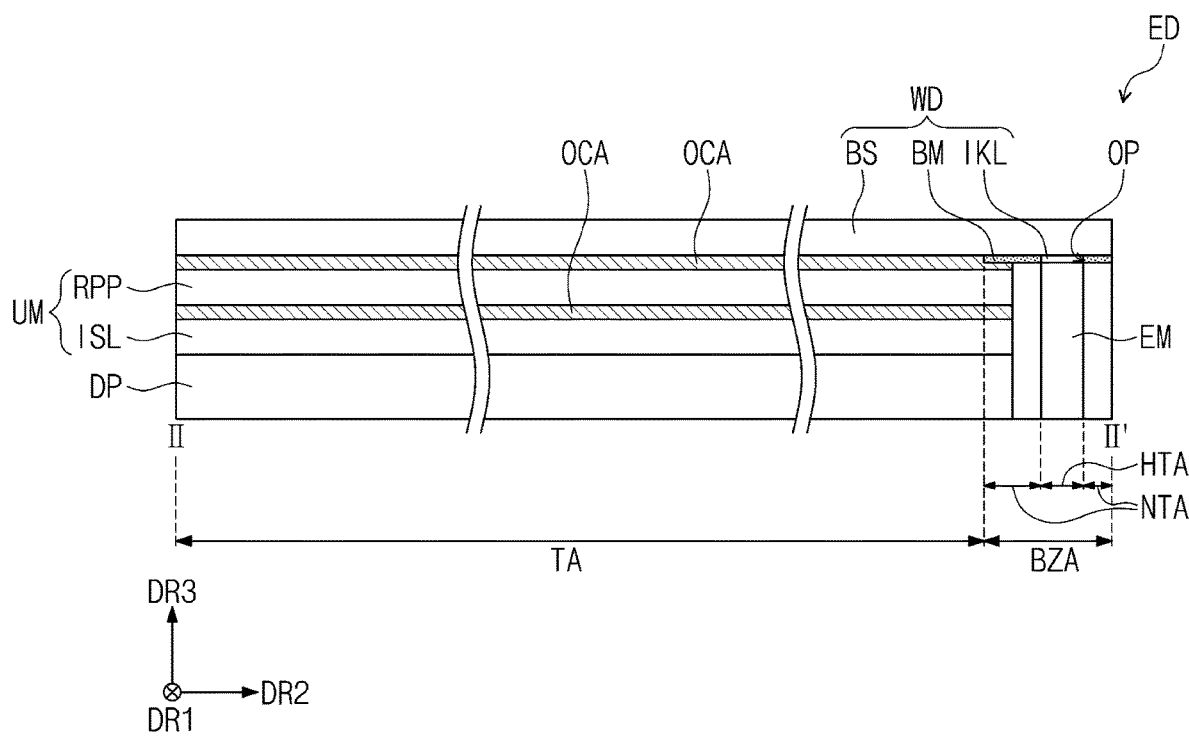
FIG. 4 is a schematic cross-sectional view of the electronic apparatus taken along line II-IT of FIG. 1.

FIG. 1 is a schematic perspective view of an electronic apparatus according to an embodiment. FIG. 2 is an exploded schematic perspective view of the electronic apparatus according to an embodiment. FIG. 3 is a schematic cross-sectional view of the electronic apparatus taken along line I-I' of FIG. 1. FIG. 4 is a schematic cross-sectional view of the electronic apparatus taken along line II-II' of FIG. 1. FIGS. 3 and 4 illustrate the stacking relationship of functional members constituting the electronic apparatus.

The electronic apparatus ED may be activated according to an electrical signal. The electronic apparatus ED may include various embodiments. For example, the electronic apparatus ED may be a personal computer, a notebook computer, a personal digital terminal, a car navigation unit, a game machine, a smart phone, a tablet, a camera, or the like. These are merely presented as examples, and other electronic apparatus embodiments are possible. In this disclosure, the electronic apparatus ED is illustrated as a smart phone as an example.

In an embodiment, the front (or upper surface) and the rear (or lower surface) of each member may be defined based on a direction in which an image IM is displayed. The front surface and the rear surface may face each other in a third direction DR3, and a normal direction of each of the front surface and the rear surface may be parallel to the third direction DR3. The third direction DR3 may refer to an upward direction, and a direction opposite to the third direction DR3 may refer to a downward direction. Directions indicated by first to third directions DR1, DR2, and DR3 may be relative concepts and may be converted into other directions. Hereinafter, the first to third directions refer to the same reference numerals as directions indicated by the first to third directions DR1, DR2, and DR3, respectively. In this specification, the expression "in plan view" may mean when viewed from the third direction DR3, for example, a normal direction.

The electronic apparatus ED may display an image IM toward the third direction DR3 on a display surface FS parallel to a plane defined by the first direction DR1 and the second direction DR2. The display surface FS on which the image IM is displayed may correspond to the front surface of the electronic apparatus ED and the front surface FS of the window WD as well. Hereinafter, the same reference numeral will be used for the display surface of the electronic apparatus ED, the front surface thereof, and the front surface of the window WD. The image IM may include a still image as well as a dynamic image. FIG. 1 illustrates a watch window and application icons as an example of the image IM.

In an embodiment, the electronic apparatus ED may be rigid or flexible. The term "flexible" may refer to a property of being bendable, and a flexible structure may include everything from a completely foldable structure to a structure that can be bent to the level of several nanometers. For example, the electronic apparatus ED may be a curved electronic apparatus or a foldable electronic apparatus.

The electronic apparatus ED according to an embodiment may include a transmission region TA and a bezel region BZA. An image IM may be displayed in the transmission region TA of the electronic apparatus ED. In an embodiment, the transmission region TA of the electronic apparatus ED may correspond to a transmission region TA of the window WD, which will be described later, and the bezel region BZA may correspond to a bezel region BZA of the window WD, which will be described later. In an embodiment, the transmission region TA of the electronic apparatus ED may correspond to a display region AA of a display panel DP, which will be described later, and the bezel region BZA thereof may correspond to a non-display region NAA of the display panel DP. In this specification, the expression "a region/portion may correspond to another region/portion" means that they overlap each other, but the expression is not limited to having a same area and/or a same shape.

The transmission region TA may have a tetragonal shape parallel to a plane defined by the first direction DR1 and the second direction DR2. However, this is illustrated as an example, and the transmission region TA may have various shapes and the shape thereof is not limited to any one embodiment.

The bezel region BZA of the electronic apparatus ED according to an embodiment may include a semi-transmission region HTA and a non-transmission region NTA. The non-transmission region NTA may block light and be disposed outside the transmission region TA to surround the transmission region TA. In an embodiment, the non-transmission region NTA may be disposed on a side surface of the electronic apparatus ED, not on the front surface thereof. In an embodiment, the non-transmission region NTA may be omitted. In an embodiment, the non-transmission region NTA may surround the semi-transmission region HTA.

Referring to FIG. 2, the electronic apparatus ED according to an embodiment may include a display device DD and an electronic module (part) EM. The display device DD may include a display panel DP disposed on the electronic module EM and an upper member UM disposed on the display panel DP. The display device DD according to an embodiment may include a window WD disposed on the display panel DP. The electronic apparatus ED according to an embodiment may include a housing CU disposed under the display panel DP. In the electronic apparatus ED according to an embodiment illustrated in FIGS. 1 and 2, the window WD and the housing CU may be coupled to each other to form an exterior of the electronic apparatus ED.

Referring to FIGS. 2 to 4, in the electronic apparatus ED according to an embodiment, the window WD may be disposed on the upper member UM. The window WD may include a base substrate BS, a light blocking pattern BM, and an ink layer IKL.

The window WD may include a bezel region BZA including a semi-transmission region HTA (or a first region) and a non-transmission region NTA (or a second region) surrounding the semi-transmission region HTA, and a transmission region TA (or a third region) adjacent to the bezel region BZA. The front surface FS of the window WD including the transmission region TA and the bezel region BZA may correspond to the front surface FS of the electronic apparatus ED. A user may visually recognize an image provided through the transmission region TA corresponding to the front surface FS of the electronic apparatus ED.

The transmission region TA may be an optically transparent region. The bezel region BZA may have a relatively low light transmittance, compared to the transmission region TA. The bezel region BZA may have a predetermined or given color. The bezel region BZA may define the shape of the transmission region TA. However, embodiments are not limited to what is illustrated, and the bezel region BZA may be disposed to be adjacent to only one side of the transmission region TA, or a portion thereof may be omitted.

The base substrate BS may include an optically transparent insulating material. The base substrate BS may be a glass or plastic substrate. For example, a tempered glass substrate may be used as the base substrate BS. In other embodiments, the base substrate BS may be formed of a flexible polymer resin. For example, the base substrate BS may include polyimide, polyacrylate, polymethylmethacrylate, polycarbonate, polyethylenenaphthalate, polyvinylidene chloride, polyvinylidene difluoride, polystyrene, ethylene-vinylalcohol copolymer, or a combination thereof. However, embodiments are not limited thereto, and any general form as a base substrate BS of a window WD may be used without limitation.

The light blocking pattern BM may be disposed on one surface of the base substrate BS. In an embodiment, the light blocking pattern BM may be provided on the lower surface of the base substrate BS adjacent to the display panel DP. The light blocking pattern BM may be disposed on an edge region of the base substrate BS. The light blocking pattern BM may be an ink printing layer. The light blocking pattern BM may be a layer formed by including a pigment or a dye.

The bezel region BZA may include a semi-transmission region HTA and a non-transmission region NTA. The non-transmission region NTA may be defined as a portion in which the light blocking pattern BM is disposed in the bezel region BZA of the window WD. The non-transmission region NTA may surround the semi-transmission region HTA. The semi-transmission region HTA may be a region overlapping the electronic module EM. The semi-transmission region HTA may be a region in which the ink layer IKL according to an embodiment, which will be described later, is disposed in the bezel region BZA of the window WD. A detailed description of the ink layer IKL will be given later.

The electronic apparatus ED may receive an external signal, which may be required for the electronic module EM, through the semi-transmission region HTA or provide a signal, which is output from the electronic module EM, to the outside. In the electronic apparatus ED according to an embodiment, the semi-transmission region HTA may be defined to overlap the bezel region BZA. However, embodiments are not limited thereto, and the semi-transmission region HTA may be defined to overlap the transmission region TA. For example, the semi-transmission region HTA may be defined to be within the transmission region TA, and a separate region provided in order to provide the semi-transmission region HTA in a region other than the transmission region TA may be omitted.

The light blocking pattern BM may include a blocking ink that blocks light. For example, the light blocking pattern BM may include a base material and a blocking ink. The blocking ink may be carbon black particles. However, embodiments are not limited thereto, and the blocking ink may include one or more pigments, dyes, or mixtures thereof in addition to the carbon black particles. The components inside the electronic apparatus ED may be prevented from being visually recognized from the outside by the light blocking pattern BM.

The light blocking pattern BM may have a single-layered structure or a multi-layered structure. The multi-layered structure may include a colored color layer and/or a black light blocking layer. The colored color layer and the black light blocking layer may be formed through a deposition, printing, or coating process. The light blocking pattern BM may be omitted or formed on functional layers other than the base substrate BS.

The window WD may further include at least one functional layer (not illustrated) provided on the base substrate BS. For example, the functional layer (not illustrated) may be a hard coating layer, an anti-fingerprint coating layer, etc., but embodiments are not limited thereto.

FIGS. 1 and 2 illustrate that the number of the semi-transmission region HTA is one, but embodiments are not limited thereto. For example, the number of the semi-transmission region HTA may be defined as two or more. FIGS. 1 and 2 illustrate that the semi-transmission region HTA is defined at the upper right side of the bezel region BZA, but the semi-transmission region HTA may be defined in various regions such as the upper left side of the bezel region BZA, the center of the bezel region BZA, the lower left side of the bezel region BZA, or the lower right side of the bezel region BZA.

In the electronic apparatus ED according to an embodiment, the upper member UM may be disposed under the window WD. The upper member UM may be disposed between the display panel DP and the window WD. According to the configuration of the upper member UM, the electronic apparatus ED may sense an external input and/or an external pressure. The upper member UM may include various members.

As illustrated in FIG. 3, the display device DD may include a display panel DP, an input sensing layer ISL, a reflection prevention panel RPP, and a window WD. In an embodiment, the upper member UM may include a reflection prevention panel RPP and an input sensing layer ISL. The reflection prevention panel RPP may have a reflection prevention function that lowers the reflectance of external light. The input sensing layer ISL may sense an external input of a user.

The input sensing layer ISL may sense an external input to obtain the position or intensity information of the external input. For example, the external input includes various types of external inputs such as a part of a user's body, light, heat, or pressure. The input sensing layer ISL may sense not only an input which comes in contact with the input sensing layer ISL, but also an input close or adjacent thereto.

The input sensing layer ISL may be disposed on (e.g., directly disposed on) the display panel DP. However, embodiments are not limited thereto, and unlike the illustration of the drawing, the input sensing layer ISL may be separately produced and coupled to the display panel DP. An adhesive layer OCA may be disposed between the input sensing layer ISL and the display panel DP.

In this specification, the expression "Configuration B is directly disposed on configuration A" may mean that there is no separate adhesive layer/member between configuration A and configuration B. After configuration A has been formed, configuration B may be formed through a continuous process on a base surface provided by configuration A.

An adhesive layer OCA may be disposed between the input sensing layer ISL and the reflection prevention panel RPP and between the reflection prevention panel RPP and the window WD, respectively. The adhesive member may be an optically transparent adhesive member. As illustrated in FIGS. 3 and 4, the input sensing layer ISL and the reflection prevention panel RPP, and the reflection prevention panel RPP and the window WD may be coupled by the adhesive layer OCA.

The display panel DP may generate an image, and the input sensing layer ISL may acquire the coordinate information of an external input (e.g., a touch event). Although not illustrated separately, a display module (part) DM according to an embodiment may further include a protection member disposed on the lower surface of the display panel DP. The protection member and the display panel DP may be coupled by an adhesive member.

The reflection prevention panel RPP may reduce the reflectance of external light incident from above the window WD. The reflection prevention panel RPP according to an embodiment may include a retarder and a polarizer. The retarder may be a film type or a liquid crystal coating type and include a $\lambda/2$ retarder and/or a $\lambda/4$ retarder. The polarizer may also be a film type and include a stretchable synthetic resin film. The retarder and the polarizer may further include a protective film. The retarder and the polarizer themselves or the protective film may be defined as a base layer of the reflection prevention panel RPP.

The reflection prevention panel RPP according to an embodiment may include color filters. The color filters may have a predetermined or given arrangement. The arrangement of the color filters may be determined in consideration of the light-emitting colors of pixels included in the display panel DP. The reflection prevention panel RPP may further include a black matrix adjacent to the color filters.

The display panel DP may be disposed under the window WD. In this specification, the term "under" may mean a direction opposite to the direction in which the display panel DP provides an image IM. In this specification, the direction indicated by the third direction DR3 may be an upward direction, and a direction opposite to the direction indicated by the third direction DR3 may mean "under". The display panel DP may display the image IM. The display panel DP may include a display surface IS including a display region AA and a non-display region NAA. The display region AA may be activated according to an electrical signal.

In an embodiment, the display region AA may be a region in which an image IM is displayed. The transmission region TA may overlap the display region AA. For example, the transmission region TA may overlap the entire surface of the display region AA or at least a portion thereof. Accordingly, a user may visually recognize the image IM through the transmission region TA.

The non-display region NAA may be covered by the bezel region BZA. The non-display region NAA may be adjacent to the display region AA. The non-display region NAA may surround the display region AA. A driving circuit or a driving line configured to drive the display region AA may be disposed in the non-display region NAA.

In the display device DD according to an embodiment, the display panel DP may be a liquid crystal display panel or a light-emitting display panel. For example, the display panel DP may be a liquid crystal display panel including a liquid crystal element, an organic electroluminescent display panel including an organic electroluminescent element, or a quantum dot light-emitting display panel including a quantum dot light-emitting element. However, embodiments are not limited thereto. In an embodiment, a liquid crystal element, an organic electroluminescent element, or a quantum dot light-emitting element may be disposed in the display region AA of the display panel DP.

The electronic module EM may overlap the semi-transmission region HTA in plan view. The electronic module EM may be disposed under the display panel DP. The electronic module EM may receive an external input transmitted through the semi-transmission region HTA or provide an output through the semi-transmission region HTA.

The electronic module EM may not overlap the display panel DP in plan view. The electronic module EM may be accommodated as a separate electronic apparatus. However, embodiments are not limited thereto, and the electronic module EM may be integrally included in the display panel DP.

The electronic module EM may include, for example, a sound output module, a light-emitting module, a light-receiving module, a camera module, and the like. The electronic module EM may be mounted on a separate substrate and electrically connected to the display panel DP through a connector (not illustrated) or the like.

The sound output module may convert sound data received from the outside or sound data stored in an electronic apparatus ED memory and output the converted sound data to the outside. The light-emitting module generates and outputs light, and for example, the light-emitting module may output infrared light. The light-receiving module may sense infrared light. The light-receiving module may be activated in case that infrared light of a predetermined or given level or more is sensed. After the infrared light generated by the light-emitting module is output, it may be reflected by an external object (e.g., a user's finger or face), and the reflected infrared light may be incident on the light-receiving module. The camera module may be configured to capture an external image. The electronic module EM may include multiple modules and is not limited to any one embodiment.

In order to allow the electronic module EM to perform a function, the semi-transmission region HTA overlapping the electronic module EM in the window WD may not be printed with a blocking ink. However, in case that the semi-transmission region HTA is not printed with the blocking ink, the electronic module EM may be visually recognized from the outside through the semi-transmission region HTA, and thus the aesthetics of the electronic apparatus ED may be deteriorated.

In an embodiment, the electronic module EM may be an infrared sensor module. In case that the electronic module EM is the infrared sensor module which uses light in the infrared wavelength band, the semi-transmission region HTA of the window WD overlapping the electronic module EM may be formed by using a material having a low transmittance with respect to light in the visible light wavelength region and having a high transmittance with respect to light in the infrared wavelength region. Accordingly, the colors of the semi-transmission region HTA and the non-transmission region NTA may be integrated, and the electronic module EM may not be visually recognized from the outside, thereby enhancing the aesthetics of the electronic apparatus ED.

In the electronic apparatus ED according to an embodiment, the housing CU may be coupled to the window WD. The housing CU may be coupled to the window WD to provide an internal space. The upper member UM, the display panel DP, and the electronic module EM may be accommodated in an internal space provided by the housing CU.

The housing CU may be produced with a material having a relatively high rigidity. For example, the housing CU may include multiple frames and/or plates including glass, plastic, metal, or a combination thereof. The housing CU may stably protect the components of the electronic apparatus ED, which are accommodated in the internal space, from an external impact.

Figure 5:
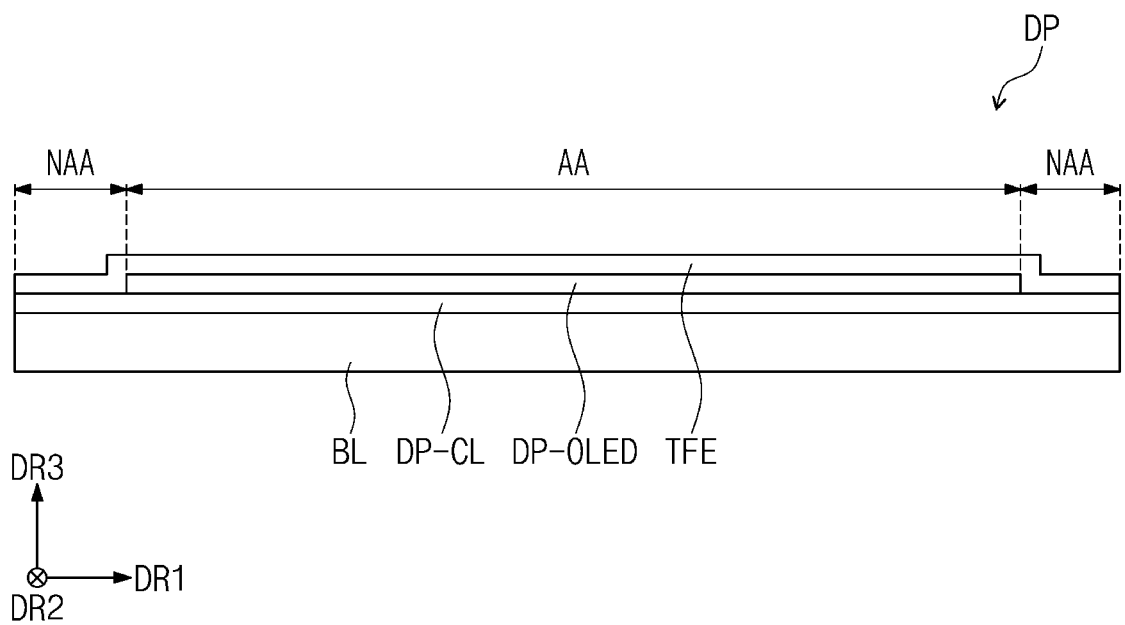
FIG. 5 is a schematic cross-sectional view of a display panel according to an embodiment.

FIG. 5 is a schematic cross-sectional view of a display panel according to an embodiment.

Referring to FIG. 5, the display panel DP according to an embodiment may include a base layer BL, a circuit layer DP-CL disposed on the base layer BL, a display element layer DP-OLED, and an upper insulating layer TFE. The base layer BL may include a plastic substrate, a glass substrate, a metal substrate, an organic/inorganic composite material substrate, and/or the like. The base layer BL may include at least one polyimide layer.

The base layer BL may include at least one synthetic resin film. The base layer BL may include a glass substrate, a metal substrate, an organic/inorganic composite material substrate, and/or the like.

The circuit layer DP-CL may include at least one insulating layer and one circuit element. The insulating layer may include at least one inorganic layer and at least one organic layer. The circuit element may include signal lines, a pixel driving circuit, and the like.

As a light-emitting element, the display element layer DP-OLED may include at least organic light-emitting diodes. The display element layer DP-OLED may further include an organic layer such as a pixel defining film.

The upper insulating layer TFE may include multiple thin films. Some of the thin films may be disposed to improve optical efficiency, and some of the thin films may be disposed to protect the organic light-emitting diodes. The upper insulating layer TFE may include a thin film encapsulation layer including a stacked structure of an inorganic layer/an organic layer/an inorganic layer.

Figure 6:
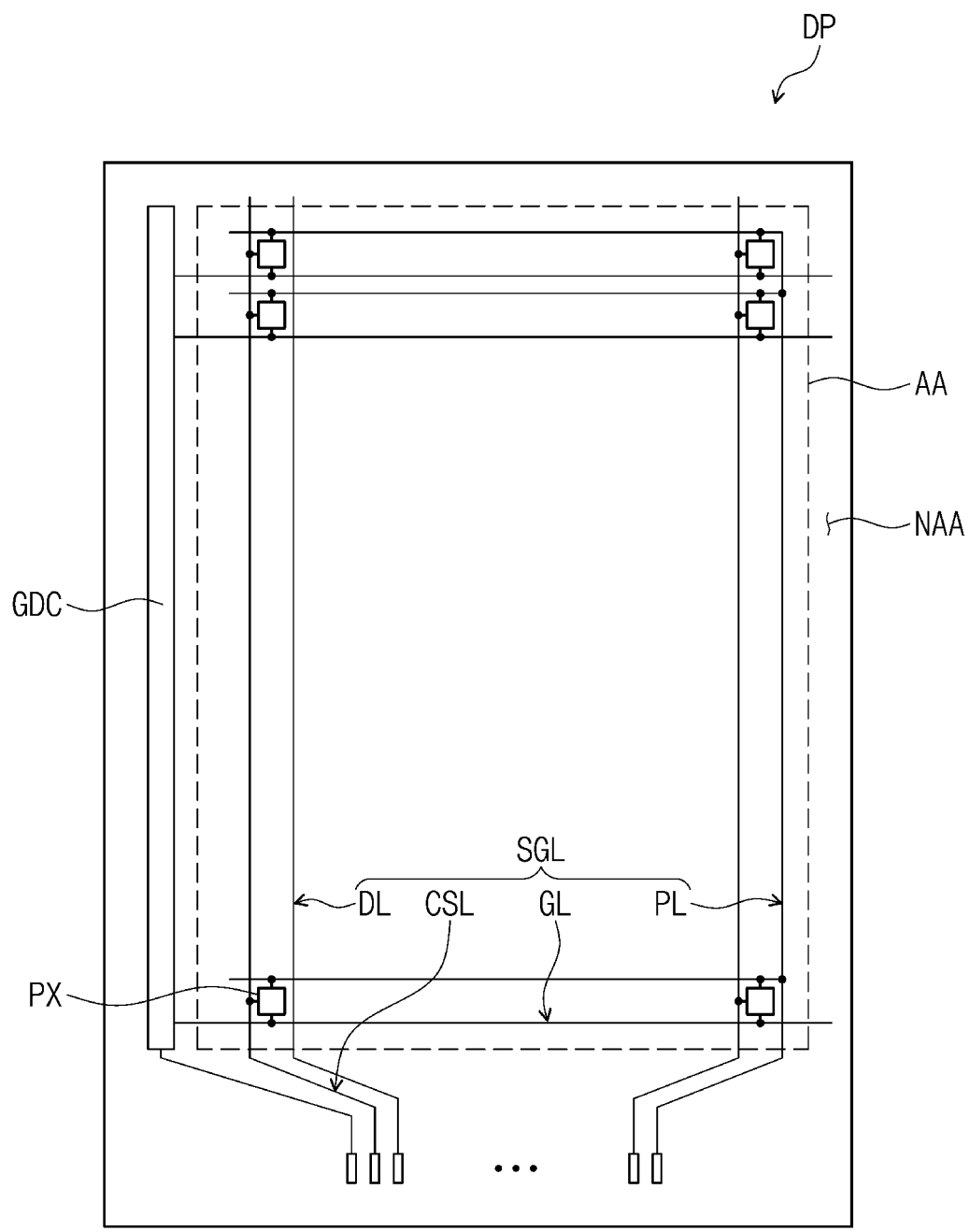
FIG. 6 is a schematic plan view of the display panel according to an embodiment.
Figure 7:
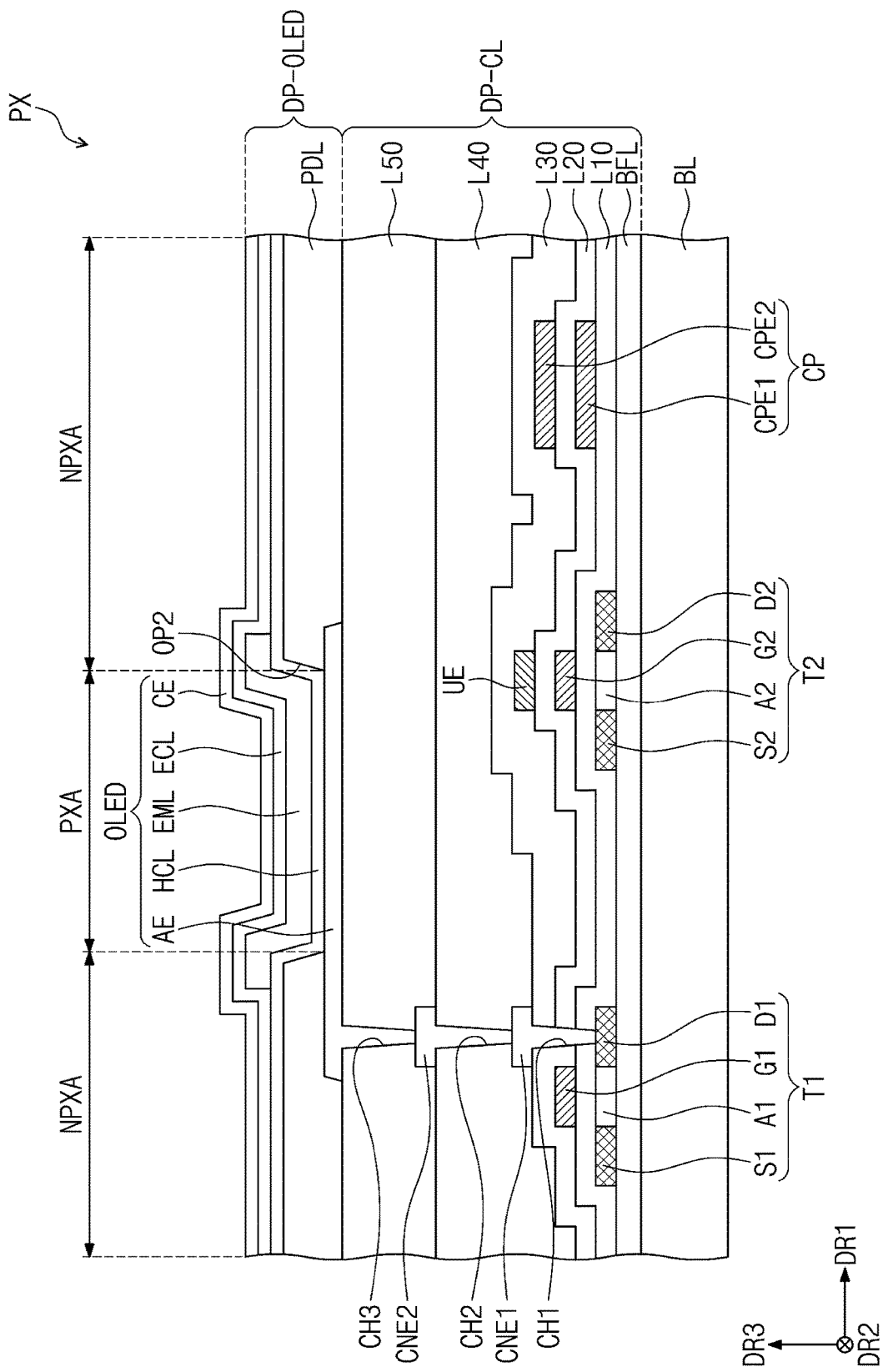
FIG. 7 is a schematic cross-sectional view of the display panel according to an embodiment.

FIG. 6 is a schematic plan view of the display panel according to an embodiment. FIG. 7 is a schematic cross-sectional view of the display panel according to an embodiment.

Referring to FIG. 6, a display region AA and a non-display region NAA may be defined in the display panel DP. In an embodiment, the non-display region NAA may be defined along the edge of the display region AA.

The display panel DP may include multiple signal lines SGL (hereinafter referred to as signal lines), multiple pixels PX (hereinafter referred to as pixels), and a driving circuit GDC. The pixels PX may be disposed in the display region AA. Each of the pixels PX may include an organic light-emitting diode and a pixel driving circuit connected thereto. The driving circuit GDC, the signal lines SGL, and the pixel driving circuit may be included in the circuit layer DP-CL illustrated in FIG. 7.

The driving circuit GDC may be disposed in the non-display region NAA. In an embodiment, the driving circuit GDC may include a scan driving circuit. The scan driving circuit may generate multiple scan signals (hereinafter, scan signals) and sequentially outputs the scan signals to multiple scan lines GL (hereinafter, scan lines) which will be described later. The scan driving circuit may further output another control signal to the driving circuit of the pixels PX.

The scan driving circuit may include multiple thin film transistors formed through the same process as that of the driving circuit of the pixels PX, for example, a low temperature polycrystaline silicon (LTPS) process or a low temperature polycrystalline oxide (LTPO) process.

The signal lines SGL may include scan lines GL, data lines DL, a power line PL, and a control signal line CSL. The signal lines SGL may further include separate reset lines and light-emitting lines. The scan lines GL may be respectively connected to a corresponding pixel PX of the pixels PX, and the data lines DL may be respectively connected to a corresponding pixel PX of the pixels PX. The power line PL may be connected to the pixels PX. The control signal line CSL may provide control signals to the scan driving circuit.

The signal lines SGL may be connected to a circuit substrate which is not illustrated. The signal lines SGL may be connected to a timing control circuit in the form of an integrated chip mounted on the circuit substrate.

FIG. 7 illustrates a cross section of a pixel PX corresponding to two transistors T1 and T2, which may constitute the pixel driving circuit, and a light-emitting diode OLED. The base layer BL according to an embodiment may include a glass substrate.

In an embodiment, the circuit layer DP-CL may include multiple insulating layers. The insulating layers may include an buffer layer BFL, a first intermediate inorganic layer L10, a second intermediate inorganic layer L20, and a third intermediate inorganic layer L30 as inorganic layers, and a first intermediate organic layer L40 and a second intermediate organic layer L50 as organic layers.

A semiconductor pattern may be disposed on the buffer layer BFL. The semiconductor pattern may include a silicon semiconductor. A first semiconductor pattern may include polysilicon. However, without being limited thereto, the first semiconductor pattern may include amorphous silicon. The semiconductor pattern may include a metal oxide semiconductor.

The semiconductor pattern may have different electrical properties depending on whether it is doped or not. The semiconductor pattern may include a first doped region having high conductivity and a second doped region having low conductivity. The first doped region may be doped with an N-type dopant or a P-type dopant. A P-type transistor includes a doped region doped with a P-type dopant. The second doped region may be a non-doped region or may be doped with a lower concentration than the first doped region.

The first doped region may have higher conductivity than the second doped region and substantially may have the role of an electrode or a signal line. The second doped region may substantially correspond to an active (or channel) of a transistor. In other words, a portion of the semiconductor pattern may be an active (or channel) of the transistor, another portion thereof may be a source (or input electrode region) or drain (output electrode region) of the transistor, and another portion thereof may be a connection signal line (or connection electrode).

As illustrated in FIG. 7, a source S1, an active A1, and a drain D1 of a first transistor T1 may be formed from the semiconductor pattern, and a source S2, an active A2, and a drain D2 of a second transistor T2 may be formed from the semiconductor pattern. On a cross section, the sources S1 and S2 and the drains D1 and D2 may extend in opposite directions from each other from the actives A1 and A2.

Control electrodes G1 and G2 may be disposed on the first intermediate inorganic layer L10 to overlap the actives A1 and A2. A first capacitor electrode CPE1 of a capacitor CP may be disposed on the first intermediate inorganic layer L10. A second capacitor electrode CPE2 of the capacitor CP may be disposed on the second intermediate inorganic layer L20. An upper electrode UE overlapping the control electrode G2 may be disposed on the second intermediate inorganic layer L20.

A first connection electrode CNE1 may be disposed on the third intermediate inorganic layer L30. The first connection electrode CNE1 may be connected to the drain D1 of the first transistor T1 through a first through-hole CH1. A second connection electrode CNE2 may be disposed on the first intermediate organic layer L40. The second connection electrode CNE2 may be connected to the first connection electrode CNE1 through a second through-hole CH2. Although not illustrated, conductive patterns different from the first connection electrode CNE1 may be disposed on the third intermediate inorganic layer L30, and conductive patterns different from the second connection electrode CNE2 may be disposed on the first intermediate organic layer L40. These conductive patterns may constitute the signal lines illustrated in FIG. 6, for example, the data lines DL.

A first electrode AE may be disposed on the second intermediate organic layer L50. The first electrode AE may be connected to the second connection electrode CNE2 through a third through-hole CH3. A pixel defining film PDL may expose at least a portion of the first electrode AE. Specifically, at least a portion of the first electrode AE may be exposed through the light-emitting opening OP2 defined in the pixel defining film PDL.

The pixel defining film PDL may be disposed on (e.g., directly disposed on) the uppermost insulating layer among the multiple insulating layers included in the circuit layer DP-CL. For example, as illustrated in FIG. 7, the pixel defining film PDL may be disposed on (e.g., directly disposed on) the second intermediate organic layer L50.

The display region AA may include a light-emitting region PXA and a non-light-emitting region NPXA adjacent to the light-emitting region PXA. The non-light-emitting region NPXA may surround the light-emitting region PXA. In an embodiment, the light-emitting region PXA may be defined to correspond to a partial region of the first electrode AE exposed by the pixel defining film PDL.

A hole control layer HCL may be commonly disposed in the light-emitting region PXA and the non-light-emitting region NPXA. The hole control layer HCL may include a hole transport layer and may further include a hole injection layer. A light-emitting layer EML may be disposed on the hole control layer HCL. The light-emitting layer EML may be disposed to correspond to the first electrode AE exposed by the pixel defining film PDL. For example, the light-emitting layer EML may be formed separately in each of the pixels. The light-emitting layer EML may include an organic material and/or an inorganic material. The light-emitting layer EML may generate a predetermined or given colored color light.

An electron control layer ECL may be disposed on the light-emitting layer EML. The electron control layer ECL may include an electron transport layer and may further include an electron injection layer. The hole control layer HCL and the electron control layer ECL may be commonly formed in multiple pixels by using an open mask. A second electrode CE may be disposed on the electron control layer ECL. The second electrode CE may be commonly disposed in multiple pixels.

Figure 8A:
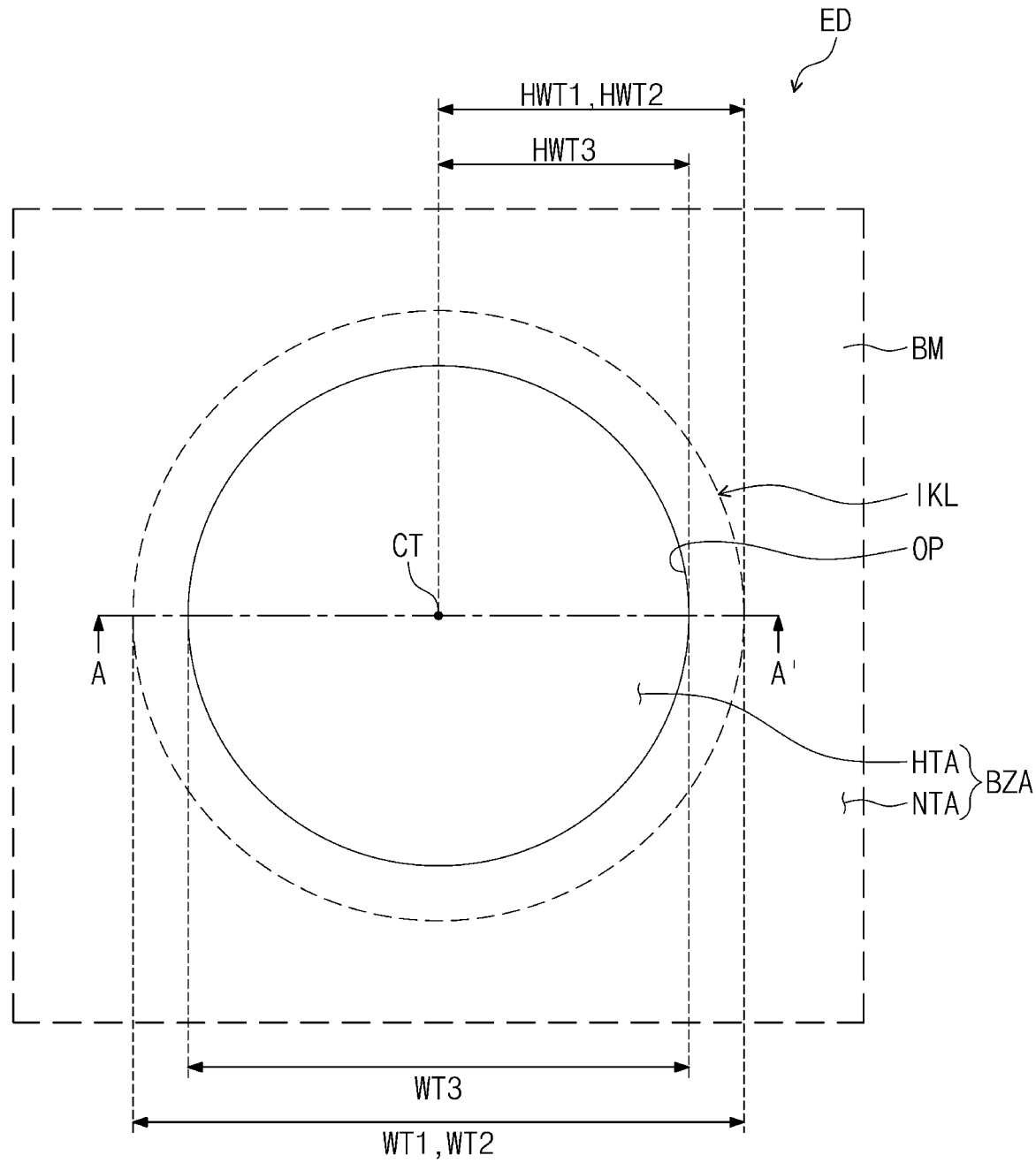
FIG. 8A is an enlarged schematic plan view of a portion of the electronic apparatus according to an embodiment.
Figure 8B:
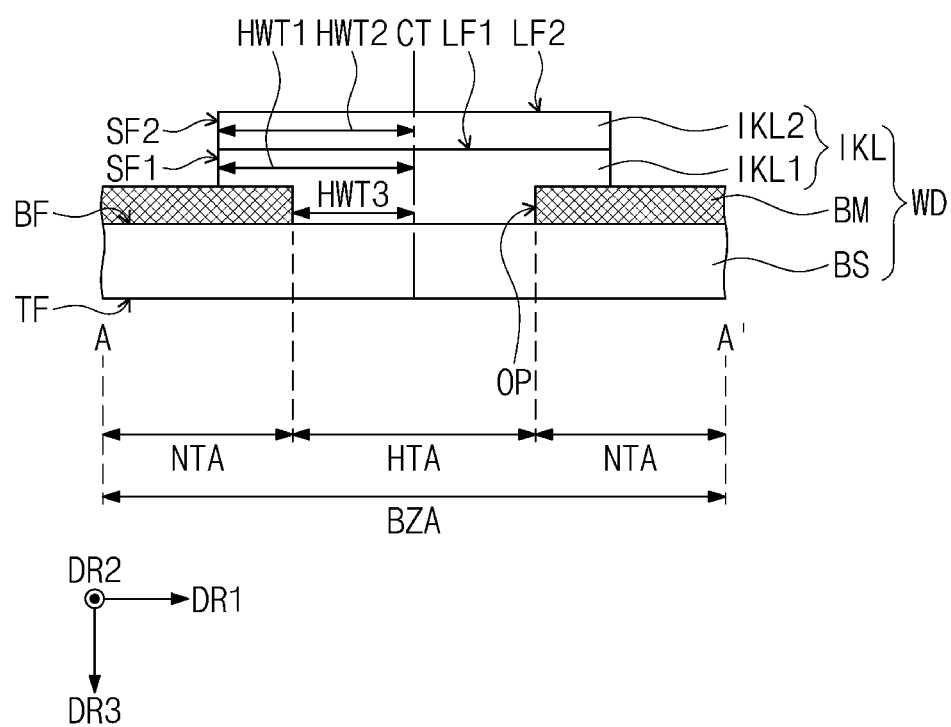
FIG. 8B is a schematic cross-sectional view of a portion of the electronic apparatus according to an embodiment.

FIG. 8A is an enlarged schematic plan view of a portion of the electronic apparatus according to an embodiment. FIG. 8B is a schematic cross-sectional view of a portion of the electronic apparatus according to an embodiment. In the electronic apparatus ED of FIG. 8A, a semi-transmission region HTA and a portion of a non-transmission region NTA around the semi-transmission region are illustrated. FIG. 8B illustrates a cross section corresponding to the line A-A' of FIG. 8A. In FIG. 8B, for convenience of explanation, the third direction DR3, which may be an upward direction, is illustrated to face downward.

The window WD may include a base substrate BS, a light blocking pattern BM, and an ink layer IKL. The base substrate BS may include a transmission region TA (refer to FIG. 2) and a bezel region BZA adjacent to the transmission region TA (refer to FIG. 2). The bezel region BZA may include a semi-transmission region HTA and a non-transmission region NTA surrounding the semi-transmission region HTA. The base substrate BS may include an upper surface TF corresponding to the front surface FS (refer to FIG. 2) of the window WD and a lower surface BF opposite to the upper surface TF.

The light blocking pattern BM may be disposed under the base substrate BS. The light blocking pattern BM may be disposed on the lower surface BF of the base substrate BS. An opening OP may be defined in the light blocking pattern BM. The light blocking pattern BM may define the bezel region BZA. A portion in which the light blocking pattern BM is disposed in the bezel region BZA may be defined as a non-transmission region NTA, and a portion in which the opening OP is defined may be defined as a semi-transmission region HTA.

In the electronic apparatus ED according to an embodiment, an opening OP may be defined in the light blocking pattern BM. The light blocking pattern BM may include an upper surface adjacent to the base substrate BS and a lower surface opposite to the upper surface. In an embodiment, the opening OP may be an opening defined from the upper surface of the light blocking pattern BM to the lower surface thereof as illustrated in FIG. 8B. A portion of the lower surface BF of the base substrate BS of the window WD may be exposed by the opening OP, and the exposed lower surface BF of the base substrate BS may come in contact with the ink layer IKL.

In an embodiment, the opening OP may have a circular shape having a center CT. In plan view, the opening OP may have a circular shape having a constant radius based on the center CT. However, embodiments are not limited thereto, and the opening OP may have a polygonal shape. In other embodiments, multiple openings OP may be provided. In this specification, the center of the opening OP may correspond to the center of the semi-transmission region HTA.

The semi-transmission region HTA may selectively transmit infrared light among visible light and infrared light. The semi-transmission region HTA may absorb visible light and transmit infrared light. For example, the semi-transmission region HTA may have a light absorptivity of about 90% or more in a wavelength range of about 400 nm to about 700 nm and a light transmittance of about 90% or more in a wavelength range of about 750 nm to about 900 nm. Therefore, the infrared light emitted from the electronic module EM may be emitted to the outside through the semi-transmission region HTA, and the infrared light reflected by an external material may reach the electronic module EM through the semi-transmission region HTA. On the other hand, since most of visible light is absorbed in the semi-transmission region HTA, the sensitivity of the electronic module EM may be improved.

The ink layer IKL may be disposed under the base substrate BS. The ink layer IKL may be disposed on the lower surface BF of the base substrate BS. The ink layer IKL may fill the opening OP formed in the light blocking pattern BM. In an embodiment, the ink layer IKL may overlap at least the semi-transmission region HTA. In an embodiment, the ink layer IKL may entirely overlap the semi-transmission region HTA. In an embodiment, at least a portion of the ink layer IKL may overlap the non-transmission region NTA. The ink layer IKL may partially overlap the non-transmission region NTA while entirely filling the opening OP. However, embodiments are not limited thereto, and the ink layer IKL may overlap only the semi-transmission region HTA and may not overlap the non-transmission region NTA.

The ink layer IKL may include a first ink layer IKL1 and a second ink layer IKL2. The first ink layer IKL1 may include a first surface LF1 and a first side surface SF1. The first surface LF1 may be spaced apart from the lower surface BF of the base substrate BS. The first surface LF1 may be parallel to a plane defined by the first direction DR1 and the second direction DR2. The first side surface SF1 may extend from the first surface LF1 and be parallel to the third direction DR3. For example, the first side surface SF1 may be perpendicular to the first surface LF1.

The second ink layer IKL2 may include a second surface LF2 and a second side surface SF2. The second surface LF2 may be spaced apart from the first surface LF1 in the third direction DR3. The second surface LF2 may be parallel to a plane defined by the first direction DR1 and the second direction DR2. The second side surface SF2 may extend from the second surface LF2 and be parallel to the third direction DR3. For example, the second side surface SF2 may be perpendicular to the second surface LF2.

In an embodiment, the first side surface SF1 of the first ink layer IKL1 and the second side surface SF2 of the second ink layer IKL2 may be aligned with each other in the third direction DR3. The first surface LF1 of the first ink layer IKL1 may be entirely covered by the second ink layer IKL2 so as not to be exposed.

The first ink layer IKL1 may be disposed on the lower surface BF of the base substrate BS, and the second ink layer IKL2 may be disposed on the first surface LF1 of the first ink layer IKL1. The second ink layer IKL2 may be disposed under (e.g., directly disposed under) the first ink layer IKL1. The second ink layer IKL2 may be disposed under (e.g., disposed directly under) the first ink layer IKL1 so as to completely cover the first surface LF1 of the first ink layer IKL1. The second ink layer IKL2 may be disposed under the first ink layer IKL1 so as to serve as a protective layer to maintain the optical properties of the first ink layer IKL1 by preventing the chemical modification of the first ink layer IKL1.

In an embodiment, the first ink layer IKL1 may come in physical contact with the light blocking pattern BM. The first ink layer IKL1 may come in contact with the lower surface of the light blocking pattern BM. In an embodiment, the second ink layer IKL2 may be disposed to be spaced apart from the light blocking pattern BM with the first ink layer IKL1 interposed therebetween. The second ink layer IKL2 may not come in contact with the light blocking pattern BM. However, without being limited thereto, the second ink layer IKL2 may come in contact with the lower surface of the light blocking pattern BM.

The first ink layer IKL1 and the second ink layer IKL2 may be formed through an integrated process so as to have an integrated shape. For example, the first ink layer IKL1 and the second ink layer IKL2 may have a shape connected to each other, and there may be no separate element between the first ink layer IKL1 and the second ink layer IKL2.

In an embodiment, the first ink layer IKL1 may have a first maximum width WT1. The second ink layer IKL2 may have a second maximum width WT2. The first maximum width WT1 of the first ink layer IKL1 may be substantially the same as the second maximum width WT2 of the second ink layer IKL2. The first maximum width WT1 may mean the width of the first ink layer IKL1 passing through the center CT in a direction DR1 (or the first direction). The second maximum width WT2 may mean the width of the second ink layer IKL2 passing through the center CT in a direction DR1.

Although not illustrated, the width of the first ink layer IKL1 passing through the center CT in the first direction DR1 may be equal to the width of the first ink layer IKL1 passing through the center CT in the second direction DR2. The width of the second ink layer IKL2 passing through the center CT in the first direction DR1 may be equal to the width of the second ink layer IKL2 passing through the center CT in the second direction DR2. However, without being limited thereto, the width of the first ink layer IKL1 passing through the center CT in the first direction DR1 may be different from the width of the first ink layer IKL1 passing through the center CT in the second direction DR2, and the first ink layer IKL1 may have an elliptical shape or the like. The width of the second ink layer IKL2 passing through the center CT in the first direction DR1 may be different from the width of the second ink layer IKL2 passing through the center CT in the second direction DR2, and the second ink layer IKL2 may have an elliptical shape or the like.

In an embodiment, the opening OP may have a third maximum width WT3. The third maximum width WT3 of the opening OP may be smaller than the first maximum width WT1 of the first ink layer IKL1 and the second maximum width WT2 of the second ink layer IKL2. However, without being limited thereto, the third maximum width WT3 of the opening OP may be substantially the same as the first maximum width WT1 of the first ink layer IKL1 and the second maximum width WT2 of the second ink layer IKL2. The third maximum width WT3 may mean the width of the opening OP passing through the center CT in a direction DR1.

In an embodiment, the first ink layer IKL1 may have a first width HWT1 with respect to a direction DR1 extending from the center CT to the non-transmission region NTA. The second ink layer IKL2 may have a second width HWT2 with respect to a direction DR1 extending from the center CT to the non-transmission region NTA. In an embodiment, the first width HWT1 of the first ink layer IKL1 may be substantially the same as the second width HWT2 of the second ink layer IKL2. In this specification, it should be understood that the expression "being substantially the same" means not only being physically the same in the numerical range of width or the like, but also being, e.g., the same in the numerical range of width or the like including process errors that may generally occur.

In an embodiment, the opening OP may have a third width HWT3 with respect to a direction DR1 extending from the center CT to the non-transmission region NTA. The third width HWT3 of the opening OP may be smaller than the first width HWT1 of the first ink layer IKL1 and the second width HWT2 of the second ink layer IKL2. However, without being limited thereto, the third width HWT3 of the opening OP may be substantially the same as the first width HWT1 and the second width HWT2.

Although not illustrated, the ink layer IKL may fill the opening OP of the light blocking pattern BM and have the same shape as the shape of the opening OP. For example, the thickness of the ink layer IKL in the third direction DR3, which may be the thickness direction of the ink layer IKL, and the depth of the opening OP in the third direction DR3 may be substantially the same as each other.

The first ink layer IKL1 may include a base resin and at least one of a pigment and a dye dispersed in the base resin. In an embodiment, the first ink layer IKL1 may include a base resin and a dye dispersed in the base resin. The ink layer IKL may have a color because it includes a pigment or a dye. Accordingly, the electronic module EM accommodated in the electronic apparatus ED may not be visually recognized from the outside.

The first ink layer IKL1 may be a layer having a high light transmittance in the infrared region. In an embodiment, the first ink layer IKL1 may have a light transmittance of about 80% or more in a wavelength range of about 750 nm to about 900 nm. For example, the first ink layer IKL1 may have a light transmittance of about 90% or more in a wavelength range of about 750 nm to about 900 nm.

The first ink layer IKL1 may be a layer having a low light transmittance in the visible light region. In the first ink layer IKL1, the light transmittance in the visible light region may be lower than the light transmittance in the infrared region. In an embodiment, the first ink layer IKL1 may have a light transmittance of about 10% or less in a wavelength range of about 540 nm. In an embodiment, the first ink layer IKL1 may have a light transmittance of about 10% or less in a wavelength range of about 400 nm to about 700 nm. In an embodiment, the first ink layer IKL1 may have a light absorptivity of about 90% or more in the visible light region. In case that the light transmittance of the first ink layer IKL1 in the visible light wavelength range satisfies the aforementioned range, the electronic module EM included in the electronic apparatus ED may not be visually recognized from the outside, and the sense of unity between the semi-transmission region HTA, in which the ink layer IKL is formed, and the non-transmission region NTA adjacent thereto may be improved. In an embodiment, at least one of a base resin, a dye, and a pigment included in the first ink layer IKL1 may absorb visible light and transmit infrared light.

The second ink layer IKL2 may be a layer having a high light transmittance in the visible light region. In an embodiment, the second ink layer IKL2 may have a light transmittance of about 90% or more in a wavelength range of about 540 nm. In an embodiment, the second ink layer IKL2 may have a light transmittance of about 80% or more, or about 90% or more in a wavelength range of about 400 nm to about 700 nm.

In an embodiment, the second ink layer IKL2 may have a lower density than the first ink layer IKL1. In an embodiment, the density of the second ink layer IKL2 may be about 1.0 g/cm$^3$ to about 2.0 g/cm$^3$. However, embodiments are not limited thereto. In this specification, physical properties, such as density, which can be changed by temperature may mean values measured at room temperature (about 25° C.) unless otherwise specified.

In case that a defect occurs during an electronic apparatus ED manufacturing process, rework may be required to reduce process costs. At this time, in order to remove an adhesive layer disposed on the window WD, physical rubbing by using a dust-free cloth and chemical rubbing through alcohol washing may be performed in parallel with each other. The ink layer IKL may be damaged, thus causing a defect in which a pigment or a dye included in the ink layer IKL may spread.

Since the window WD according to an embodiment includes the ink layer IKL including the second ink layer IKL2 configured to serve as a protective layer on the first ink layer IKL1, it may be possible to prevent the window WD from being damaged during a rubbing process. In particular, since the ink layer IKL according to an embodiment has excellent chemical resistance and abrasion resistance, it may be less damaged during the rubbing process and therefore can be effectively protected.

Figure 9A:
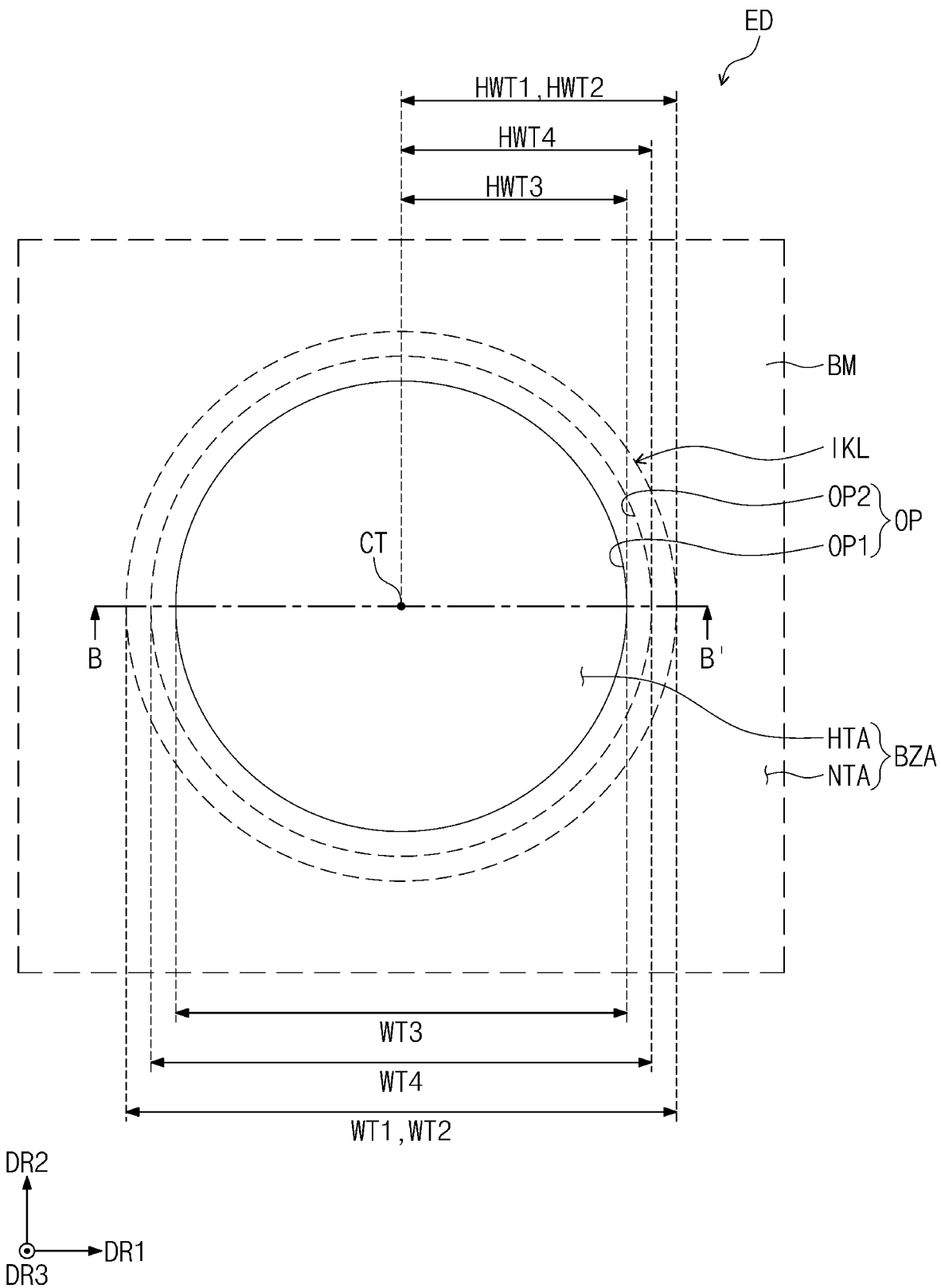
FIG. 9A is an enlarged schematic plan view of a portion of the electronic apparatus according to an embodiment.
Figure 9B:
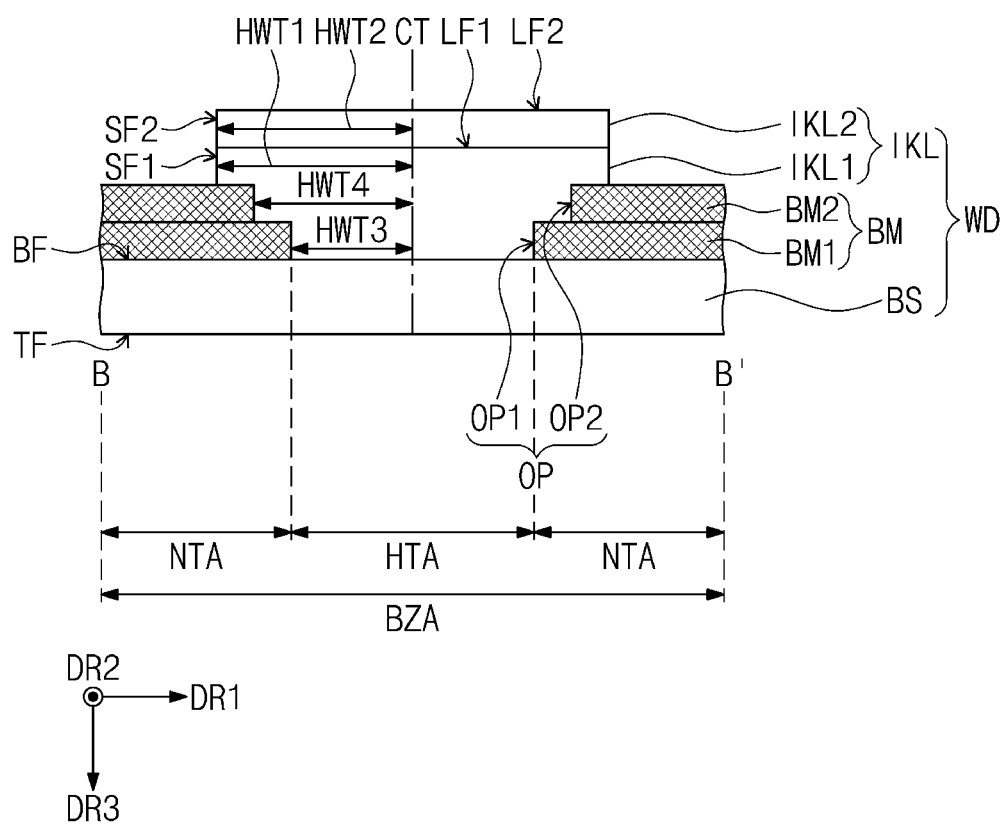
FIG. 9B is a schematic cross-sectional view of a portion of the electronic apparatus according to an embodiment.

FIG. 9A is an enlarged schematic plan view of a portion of the electronic apparatus according to an embodiment. FIG. 9B is a schematic cross-sectional view of a portion of the electronic apparatus according to an embodiment. In the electronic apparatus ED of FIG. 9A, a semi-transmission region HTA and a partial non-transmission region NTA around the semi-transmission region are illustrated. FIG. 9B illustrates a cross section corresponding to the line B-B' of FIG. 9A. In FIG. 9, for convenience of explanation, the third direction DR3, which may be an upward direction, is illustrated to face downward. The same reference numerals are assigned to the same components as those described in FIGS. 8A and 8B, and redundant descriptions will be omitted.

The window WD may include a base substrate BS, a light blocking pattern BM, and an ink layer IKL. The base substrate BS may include an upper surface TF corresponding to the display surface FS (refer to FIG. 2) of the window WD and a lower surface BF opposite to the upper surface TF. The light blocking pattern BM and the ink layer IKL may be disposed on a portion of the lower surface BF of the base substrate BS. The light blocking pattern BM may be disposed on the lower surface BF of the base substrate BS and overlap the non-transmission region NTA of the bezel region BZA. The ink layer IKL may be disposed on the lower surface BF of the base substrate BS and overlap the semi-transmission region HTA of the bezel region BZA.

In an embodiment, the window WD may include multiple light blocking patterns. FIGS. 9A and 9B illustrate that the light blocking pattern is composed of two layers. Referring to FIGS. 9A and 9B, the light blocking pattern BM may include a first light blocking pattern BM1 and a second light blocking pattern BM2. The first light blocking pattern BM1 may be disposed under the base substrate BS, and the second light blocking pattern BM2 may be disposed under the first light blocking pattern BM1. For example, the light blocking pattern BM may include the first light blocking pattern BM1 and the second light blocking pattern BM2 sequentially stacked on each other under the base substrate BS.

In an embodiment, the first light blocking pattern BM1 and the second light blocking pattern BM2 may have the same thickness as each other with respect to the third direction DR3 which may be the thickness direction. However, without being limited thereto, the first light blocking pattern BM1 and the second light blocking pattern BM2 may have different thicknesses with respect to the third direction DR3.

Each of the first light blocking pattern BM1 and the second light blocking pattern BM2 may include a blocking ink that blocks light. For example, each of the first light blocking pattern BM1 and the second light blocking pattern BM2 may include a base material and a blocking ink. The blocking ink may be carbon black particles. However, embodiments are not limited thereto, and the blocking ink may include one or more pigments, dyes, or mixtures thereof in addition to the carbon black particles. In an embodiment, the first light blocking pattern BM1 and the second light blocking pattern BM2 may include materials different from each other. However, without being limited thereto, the first light blocking pattern BM1 and the second light blocking pattern BM2 may include the same material as each other.

In the electronic apparatus ED according to an embodiment, an opening OP may be defined in the light blocking pattern BM. The opening OP may include a first opening OP1 and a second opening OP2. In an embodiment, the first opening OP1 overlapping at least the semi-transmission region HTA may be defined in the first light blocking pattern BM1. The first light blocking pattern BM1 may include an upper surface adjacent to the base substrate BS and a lower surface opposite to the upper surface. The first opening OP1 may be an opening defined from the upper surface of the first light blocking pattern BM1 to the lower surface thereof. The second opening OP2 overlapping at least the semi-transmission region HTA may be defined in the second light blocking pattern BM2. The second light blocking pattern BM2 may include an upper surface adjacent to the first light blocking pattern BM1 and a lower surface opposite to the upper surface. The second opening OP2 may be an opening defined from the upper surface of the second light blocking pattern BM2 to the lower surface thereof. A portion of the lower surface BF of the base substrate BS of the window WD may be exposed by the first opening OP1 and the second opening OP2, and the ink layer IKL may come in contact with the exposed lower surface BF of the base substrate BS.

The first ink layer IKL1 may come in contact with the light blocking pattern BM. The first ink layer IKL1 may come in contact with the lower surface of the second light blocking pattern BM2. In an embodiment, the second ink layer IKL2 may be disposed to be spaced apart from the light blocking pattern BM with the first ink layer IKL1 interposed therebetween. The second ink layer IKL2 may not come in contact with the second light blocking pattern BM2. However, without being limited thereto, the second ink layer IKL2 may come in contact with the lower surface of the second light blocking pattern BM2.

Each of the first opening OP1 and the second opening OP2 may have a circular shape having a center CT. Each of the first opening OP1 and the second opening OP2 may have a circular shape having a constant radius with respect to the center CT in plan view. However, embodiments are not limited thereto, and at least one of the first opening OP1 and the second opening OP2 may have a polygonal shape.

The first ink layer IKL1 may have a first maximum width WT1. The second ink layer IKL2 may have a second maximum width WT2. The first maximum width WT1 of the first ink layer IKL1 may be substantially equal to the second maximum width WT2 of the second ink layer IKL2. The first maximum width WT1 may mean the width of the first ink layer IKL1 passing through the center CT in a direction DR1 (or the first direction). The second maximum width WT2 may mean the width of the second ink layer IKL2 passing through the center CT in a direction DR1.

The first opening OP1 may have a third maximum width WT3. The third maximum width WT3 may mean the width of the first opening OP1 passing through the center CT in a direction DR1. In an embodiment, the second opening OP2 may have a fourth maximum width WT4. The fourth maximum width WT4 may mean the width of the second opening OP2 passing through the center CT in the direction DR1. The third maximum width WT3 of the first opening OP1 may be greater than the fourth maximum width WT4 of the second opening OP2. In an embodiment, the third maximum width WT3 of the first opening OP1 may be smaller than the first maximum width WT1 of the first ink layer IKL1 and the second maximum width WT2 of the second ink layer IKL2.

The first ink layer IKL1 may have a first width HWT1 with respect to a direction DR1 extending from the center CT to the non-transmission region NTA. The second ink layer IKL2 may have a second width HWT2 with respect to a direction DR1 extending from the center CT to the non-transmission region NTA. In an embodiment, the first width HWT1 of the first ink layer IKL1 may be substantially the same as the second width HWT2 of the second ink layer IKL2.

The first opening OP1 may have a third width HWT3 with respect to a direction DR1 extending from the center CT to the non-transmission region NTA. The second opening OP2 may have a fourth width HWT4 with respect to a direction DR1 extending from the center CT to the non-transmission region NTA. The third width HWT3 of the first opening OP1 may be smaller than the fourth width HWT4 of the second opening OP2. In an embodiment, each of the first width HWT1 of the first ink layer IKL1 and the second width HWT2 of the second ink layer IKL2 may be greater than the fourth width HWT4 of the second opening OP2.

FIGS. 9A and 9B illustrate that the light blocking pattern BM includes the first light blocking pattern BM1 and the second light blocking pattern BM2 that are sequentially stacked on each other, but this is only an example and embodiments are not limited thereto. The light blocking pattern BM may include three or more light blocking patterns. The opening defined by the inner surfaces of the light blocking patterns may have a step shape in which the maximum width thereof increases as the window WD moves away from the base substrate BS.

Figure 10:
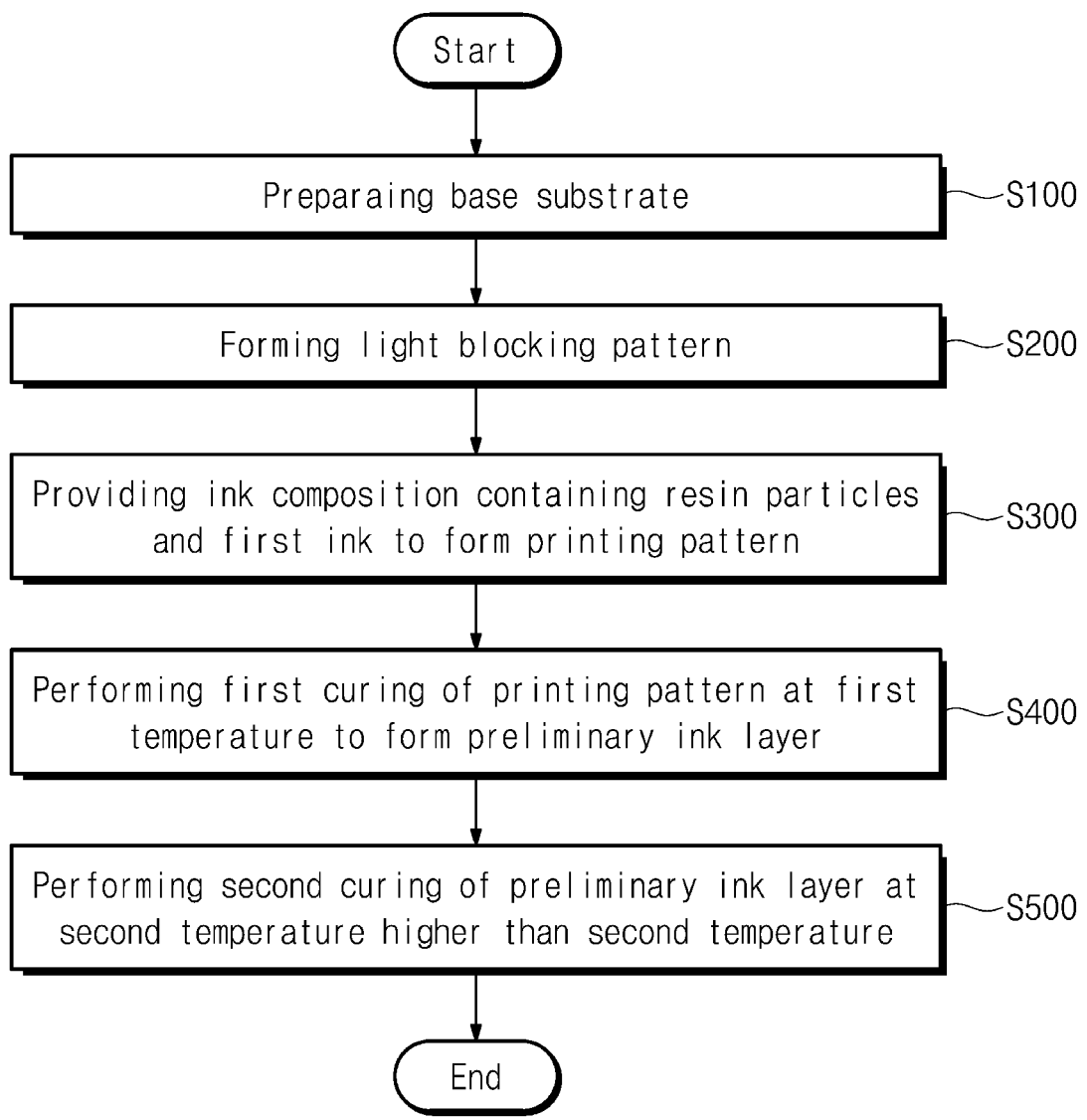
FIG. 10 is a flowchart schematically illustrating a method of manufacturing the electronic apparatus according to an embodiment.

FIG. 10 is a flowchart schematically illustrating a method of manufacturing the electronic apparatus according to an embodiment. Referring to FIG. 10, the method of manufacturing the electronic apparatus according to an embodiment may include preparing a base substrate (S100), forming a light blocking pattern (S200), providing an ink composition including resin particles and a first ink to form a printing pattern (S300), performing a first curing of the printing pattern at a first temperature to form a preliminary ink layer (S400), and performing a second curing of the preliminary ink layer at a second temperature (S500).

FIGS. 11A to 11D are cross-sectional views schematically illustrating some steps of the method of manufacturing the electronic apparatus according to an embodiment. FIGS. 11A to 11D sequentially illustrate the forming of a window in the method of manufacturing the electronic apparatus according to an embodiment. In FIGS. 11A to 11D, for convenience of explanation, the third direction DR3, which may be an upward direction, is illustrated to face downward. Hereinafter, in describing the method of manufacturing the electronic apparatus according to an embodiment with reference to FIGS. 11A to 11D, the same reference numerals are assigned to the same components as those described above, and redundant descriptions thereof will be omitted.

Figure 11A:
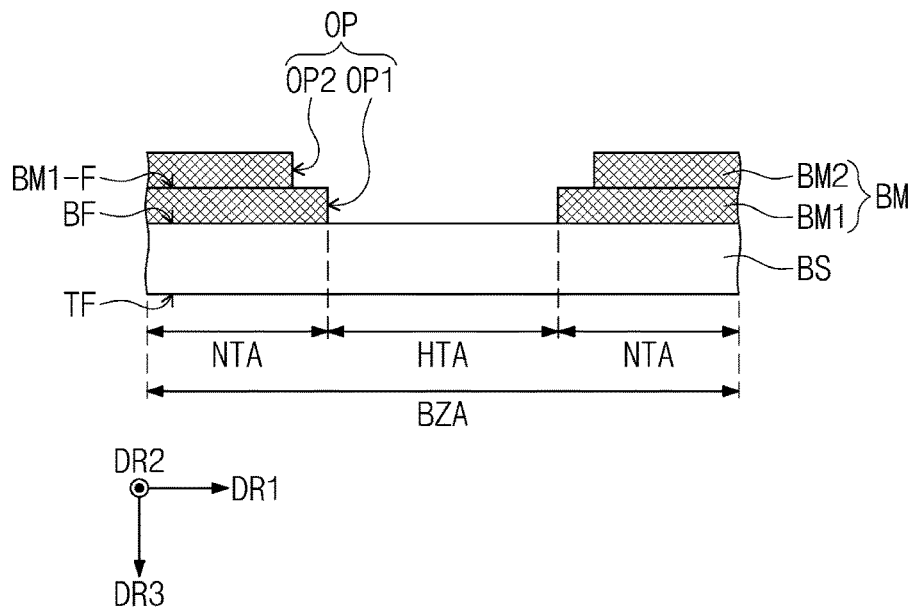
FIGS. 11A to 11D are cross-sectional views schematically illustrating the steps of the method of manufacturing the electronic apparatus according to an embodiment.

Referring to FIG. 11A, a bezel region BZA including a semi-transmission region HTA and a non-transmission region NTA surrounding the semi-transmission region HTA may be defined in a base substrate BS. The transmission region TA of the base substrate BS illustrated in FIG. 4 is omitted from FIGS. 11A to 11D for convenience of description.

The base substrate BS may include an upper surface TF corresponding to the front surface FS (refer to FIG. 2) of the window WD (refer to FIG. 2) and a lower surface BF opposite to the upper surface TF. The upper surface TF of the base substrate BS may be opposite to the lower surface BF of the base substrate BS in the third direction DR3.

A first light blocking pattern BM1 may be formed on the lower surface BF of the base substrate BS. A method of forming the first light blocking pattern BM1 is not particularly limited, but it may be formed by, for example, a screen printing process. The first light blocking pattern BM1 may be formed to have a first opening OP1 therein. The first opening OP1 may have a circular shape in plan view. The first opening OP1 may have a circular shape having a constant radius with respect to the center of the first opening OP1 in plan view. After the first light blocking pattern BM1 is printed on the lower surface BF of the base substrate BS, a drying process may be further performed. However, embodiments are not limited thereto.

A second light blocking pattern BM2 may be formed on the first light blocking pattern BM1. The second light blocking pattern BM2 may be formed in the same manner as the first light blocking pattern BM1, but embodiments are not limited thereto. For example, the second light blocking pattern BM2 may be formed through a screen printing process. The second light blocking pattern BM2 may be formed to have a second opening OP2 therein. The second opening OP2 may have a circular shape in plan view. The second opening OP2 may have a circular shape having a constant radius with respect to the center of the second opening OP2 in plan view.

In plan view, the second opening OP2 of the second light blocking pattern BM2 may be formed to have a larger diameter than the first opening OP1 of the first light blocking pattern BM1. A lower surface BM1-F of the first light blocking pattern BM1 may not be entirely covered by the second light blocking pattern BM2, and a portion of the lower surface BM1-F of the first light blocking pattern BM1 adjacent to the first opening OP1 may be exposed. The opening OP may have a step shape having a larger diameter as it moves away from the lower surface BF of the base substrate BS.

Figure 11B:
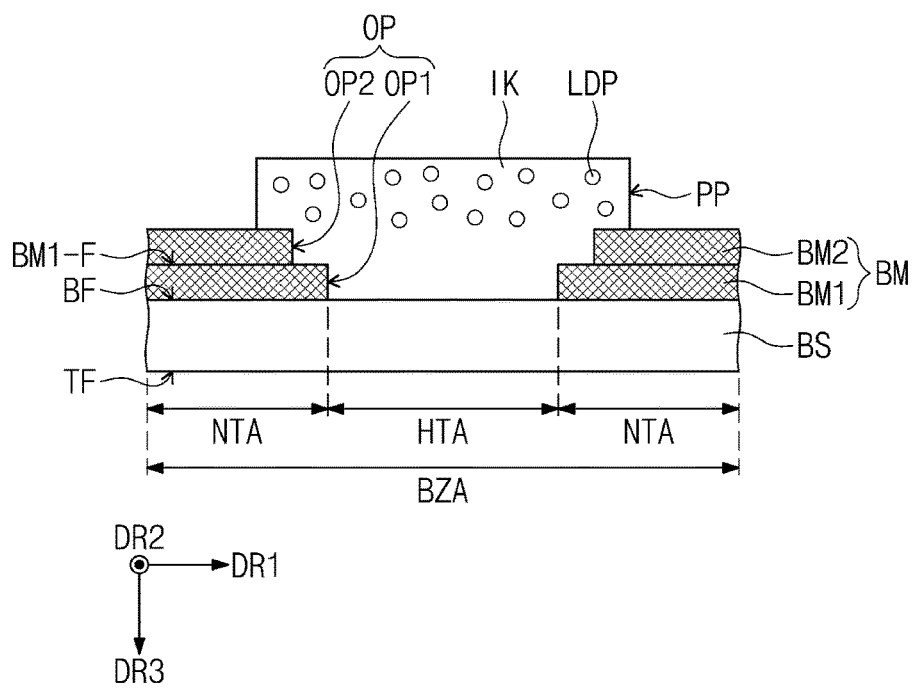

Referring to FIGS. 11A and 11B, an ink composition for forming the ink layer IKL (refer to FIG. 11D) may be provided to the semi-transmission region HTA in which the light blocking pattern BM is not formed. The ink composition may be provided to fill the opening OP defined in the light blocking pattern BM. The ink composition may be provided to fill the first opening OP1 defined in the first light blocking pattern BM1 and the second opening OP2 defined in the second light blocking pattern BM2. The ink composition may include a first ink IK and resin particles LDP.

The first ink IK may be provided to the semi-transmission region HTA to prevent the electronic module EM (FIG. 2) from being visually recognized from the outside and may be a coloring material having a high transmittance in the wavelength range of light output from or input to the electronic module EM (refer to FIG. 2). The first ink IK may be a coloring material including a dye or a pigment. In an embodiment, the first ink IK may be a coloring material including a dye. In an embodiment, the first ink IK may include a base resin and a dye. In an embodiment, the base resin may be a thermosetting resin.

The resin particles LDP may be provided by being included in the ink composition. The resin particles LDP may be used to form the aforementioned second ink layer IKL2 (refer to FIG. 11D). The resin particles LDP may be a component for forming the second ink layer IKL2 (refer to FIG. 11D). The ink composition may include one or more types of resin particles LDP. For example, the ink composition may include one type of resin particles LDP or two different types of resin particles LDP.

In an embodiment, the resin particles LDP may include particles made of a thermosetting resin. The resin particles LDP may include at least one of polyurethane resin particles, phenol resin particles, urea resin particles, epoxy resin particles, polyester resin particles, polyimide resin particles, and melamine resin particles. For example, the resin particles LDP may include any one of polyurethane resin particles, phenol resin particles, urea resin particles, epoxy resin particles, polyester resin particles, polyimide resin particles, and melamine resin particles, or a mixture of two or more materials selected therefrom.

The resin particles LDP may be obtained by polymerizing a polymer resin. The method for producing the resin particles LDP is not particularly limited as long as resin particles having a desired composition and physical properties can be obtained. It may be possible to adjust the diameter of the resin particles LDP through an additional pulverizing step if necessary.

The resin particles LDP may be a polymer having the form of a homopolymer, a random copolymer, a block copolymer, a graft copolymer, and/or the like.

The resin particles LDP may be in powder form or granular form. The resin particles LDP may be implemented in various shapes. Although the resin particles LDP are illustrated as particles having a circular cross section in FIGS. 11B and 11C, this is illustrated for convenience of description and does not show the actual shape of the resin particles LDP.

The resin particles LDP may be included in an amount of about 10 wt % to about 20 wt %, based on the total amount of the ink composition forming the ink layer IKL. The content of the resin particles LDP may be appropriately adjusted within the aforementioned range in order to realize a desired thickness and optical properties of the second ink layer IKL2.

The ink composition may further include a thermosetting agent. The thermosetting agent may be included without being limited as long as it is a material capable of inducing a polymerization reaction by being activated by heat, and in an embodiment, the thermosetting agent may include an amine-based thermosetting agent or an imidazole-based thermosetting agent. The amine-based curing agent may use an aliphatic amine, a modified aliphatic amine, an aromatic amine, a secondary amine, a tertiary amine, or the like, and for example, include benzyldimethylamine, triethanolamine, triethylene tetramine, diethylenetriamine, triethyleneamine, dimethylaminoethanol, tri(dimethylaminomethyl)phenol, and the like. The imidazole-based curing agent may include imidazole, isoimidazole, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, adduct of imidazole and methylimidazole, adduct of imidazole and trimellitic acid, 2-n-heptadecyl-4-methylimidazole, phenylimidazole, benzyl midazole, 2-methyl-4,5-diphenylimidazole, 2,3,5-triphenylimidazole, 2-styrylimidazole, 1-(dodecyl benzyl)-2-methylimidasol, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di (4,5-diphenyl-2-imidazole)-benzene-1,4,2-naphthyl-4,5-diphenylimidazole, 1-benzyl-2-methylimidazole, 2-p-methoxystyrylimidazole, and the like.

Referring back to FIG. 11B, the ink composition may be provided on the lower surface BF of the base substrate BS to form a printing pattern PP. The ink composition may be provided to fill the opening OP of the light blocking pattern BM on the lower surface BF of the base substrate BS. The printing pattern PP may include the first ink IK and the resin particles LDP.

In an embodiment, the density of the resin particles LDP may be lower than the density of the first ink IK. The density of a material may affect the position of particles. Most of the resin particles LDP having a relatively low density may be positioned at the upper portion of the printing pattern PP.

The state of the printing pattern PP may mean a state in which the resin particles LDP are preliminarily phase-separated. As the printing pattern PP includes the resin particles LDP having a relatively low density, the resin particles LDP may move upward in the printing pattern PP. Accordingly, in the printing pattern PP, most of the resin particles LDP may be positioned at the upper portion thereof, and most of the first ink IK may be positioned at the lower portion thereof. In this specification, concentration distribution according to the positions of the first ink IK and the resin particles LDP in the printing pattern PP before a first curing may be referred to as preliminary phase separation.

Figure 11C:
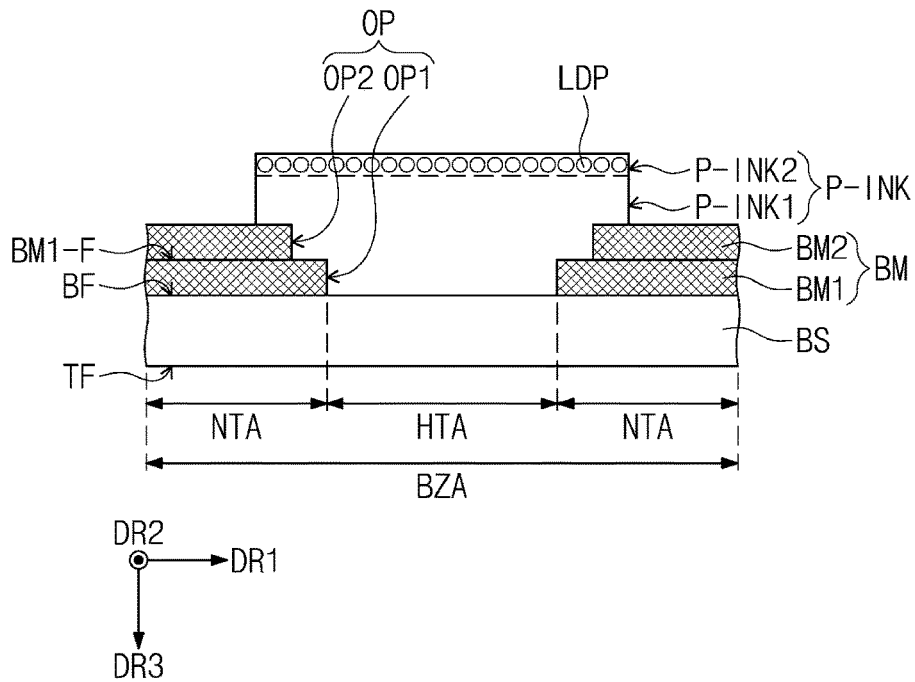

Referring to FIGS. 11B and 11C, the first curing of the printing pattern PP may be performed to form a preliminary ink layer P-INK. The first curing of the printing pattern PP may be performed at a first temperature. The first temperature may be a temperature at which the first ink IK is cured. In an embodiment, the first temperature is not particularly limited, but may be about 100° C. to about 180° C. However, embodiments are not limited thereto, and the first temperature may be appropriately selected according to the type and capacity of the material included in the first ink IK, the melting point of the resin particles LDP which is used, or the like.

In the first curing of the printing pattern PP, the first ink IK may be cured. At this time, while the resin particles LDP are pushed out of the cured first ink IK, phase separation may occur. Each phase, which is phase-separated in the preliminary ink layer P-INK, may include a first phase, in which the base resin included in the first ink IK constitutes most of the content, and a second phase, which is disposed on the first phase and in which the resin particles LDP may constitute of the content. In this specification, the expression "phase separation" may refer to a phenomenon in which division is made into at least two layers due to a difference in physical properties such as density between constituents. For example, the preliminary ink layer P-INK may be divided into two layers due to a difference in density between the resin particles LDP and the first ink IK.

The resin particles LDP may have a melting point higher than the first temperature applied in the first curing. Since the ink composition includes the resin particles LDP having a melting point higher than the first temperature, the resin particles LDP may not be melted in the first curing and may be phase-separated to the upper portion of the preliminary ink layer P-INK. The resin particles LDP may have a melting point higher than the curing temperature of the first ink IK. For example, the resin particles LDP may have a melting point that is at least about 1° C. higher than the first temperature applied in the first curing.

Since the first temperature is less than the melting point of the resin particles LDP, the resin particles LDP may not be melted and may maintain a solid form. While the first ink IK is cured in the first curing, the resin particles LDP may be phase-separated to the upper portion of the preliminary ink layer P-INK. Due to having a lower density than the first ink IK, the resin particles LDP may readily move to the upper portion of the preliminary ink layer P-INK in the first curing.

The melting point of the resin particles LDP may be about 150° C. to about 400° C. However, embodiments are not limited thereto. The melting point of the resin particles LDP may be variously changed depending on a type of material and a manufacturing process. In case that the melting point of the resin particles LDP is about 150° C. to about 400° C., the curing of the resin particles LDP may be sufficiently progressed during curing without impairing the physical properties of the resin particles LDP. In case that the melting point of the resin particles LDP is greater than 400° C., the curing temperature in the second curing may be too high, thus deteriorating the film quality of the ink layer IKL formed thereafter. In case that the melting point of the resin particles LDP is less than 150° C., it may be difficult to produce the ink layer IKL having desired physical properties because some of the resin particles LDP are melted before phase separation.

In this specification, the melting point of the resin particles LDP may be obtained by differential scanning calorimetry (DSC). For example, the melting point of the resin particles LDP may be obtained from the endothermic peak measured by differential scanning calorimetry. In case that the resin particles LDP are composed of two types of resin particles having different melting points, multiple endothermic peaks may be formed in a differential scanning calorimetry (DSC) curve due to a difference in melting point between the two types of the resin particles. The peak temperature of the endothermic peak shown at the highest temperature in the differential scanning calorimetry (DSC) curve may mean the melting point of the resin particles LDP.

Referring to FIG. 11C, a preliminary ink layer P-INK may be formed after the first curing. The preliminary ink layer P-INK may include a first preliminary ink layer P-INK1 and a second preliminary ink layer P-INK2. The preliminary ink layer P-INK may include the first preliminary ink layer P-INK1 formed by the curing of the first ink IK and the second preliminary ink layer P-INK2 disposed on the first preliminary ink layer P-INK1 and including the resin particles LDP. The resin particles LDP included in the second preliminary ink layer P-INK2 may exist in an unmelted state.

The resin particles LDP may not be substantially distributed in the first preliminary ink layer P-INK1 of the preliminary ink layer P-INK. In this specification, the expression "being not substantially distributed" may mean less than about 1 wt %, based on the total amount of the entire constituent particles. For example, the expression that the resin particles LDP are not substantially distributed in the first preliminary ink layer P-INK1 may mean that the content rate of the resin particles LDP included in the first preliminary ink layer P-INK1 is less than about 1 wt %, based on the total amount of the resin particles LDP included in the preliminary ink layer P-INK.

In FIG. 11C, the resin particles LDP included in the preliminary ink layer P-INK are illustrated as being provided in one regularly arranged row, but this is illustrated as an example for convenience of explanation. The resin particles LDP may be provided in multiple rows in the preliminary ink layer P-INK and have a random arrangement shape.

Figure 11D:
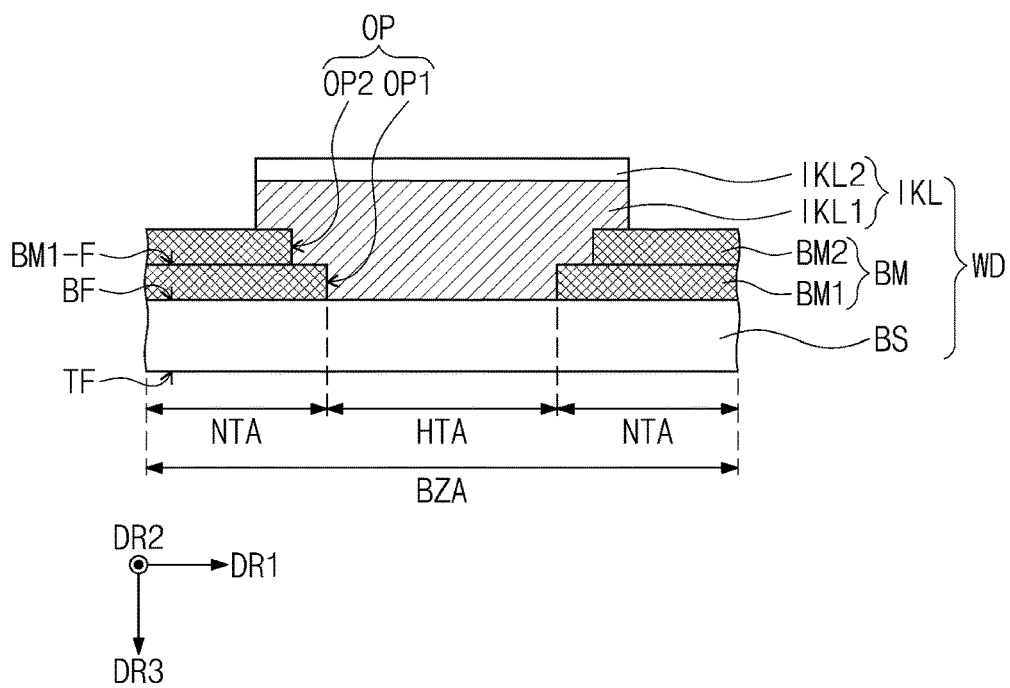

Referring to FIGS. 11C and 11D, the second curing of the preliminary ink layer P-INK may be performed to form the ink layer IKL. The second curing of the preliminary ink layer P-INK may be performed at a second temperature. In an embodiment, the second temperature may be equal to or greater than the melting point of the resin particles LDP. In an embodiment, the second temperature may be the curing temperature of the resin particles LDP. In an embodiment, the second temperature is not particularly limited, but may be about 150° C. to about 400° C. However, without being limited thereto, the second temperature may be appropriately selected according to the type and capacity of the resin particles LDP.

As the second temperature is applied to the preliminary ink layer P-INK, the resin particles LDP may be melted. The second curing of the preliminary ink layer P-INK at the second temperature may be a step in which the resin particles LDP are melted and thermally cured. As the second temperature equal to or higher than the melting point of the resin particles LDP is applied, the resin particles LDP may be melted and thermally cured.

In the second curing of the preliminary ink layer P-INK at the second temperature, the second preliminary ink layer P-INK2 including the resin particles LDP may be heated in a state in which it has the second temperature. The resin particles LDP included in the second preliminary ink layer P-INK2 may be melted at the second temperature so as to be flowable and finally form the second ink layer IKL2 of the ink layer IKL through a polymerization step.

After the second curing of the preliminary ink layer P-INK, the ink layer IKL may be formed. For example, after the second curing, a first ink layer IKL1 including the polymer of the first ink IK and a second ink layer IKL2 including the polymer of the resin particles LDP may be formed. The first ink layer IKL1 may have the same state as the first preliminary ink layer P-INK1. The curing degrees of the first ink layer IKL1 and the first preliminary ink layer P-INK1 may be the same as each other. However, embodiments are not limited thereto. For example, after the first curing, the first preliminary ink layer P-INK1 may be in a partially cured state, and through the second curing, the uncured portion thereof may be additionally cured to form the first ink layer IKL1.

The resin particles LDP may be melted and cured in a phase-separated state at the upper portion of the first ink layer IKL1 to form a certain layer on the first ink layer IKL1. As the resin particles LDP are melted, a contact area between the resin particles LDP and the upper surface of the first ink layer IKL1 may be increased. The melted resin particles LDP may be disposed on the first ink layer IKL1 so as to have a uniform thickness. The melted resin particles LDP may be cured to form an interface with the upper surface of the first ink layer IKL1 so as to form a certain layer, for example, the second ink layer IKL2 on the first ink layer IKL1. A separate layer may not exist between the first ink layer IKL1 and the second ink layer IKL2.

The second ink layer IKL2 formed of the resin particles LDP may have the same density as the resin particles LDP. However, without being limited thereto, the densities of the resin particles LDP and the second ink layer IKL2 may be different from each other. The density of the resin particles LDP may be affected by a crosslink density, a molecular structure, a rate of micropores, and the like. For example, the density of the resin particles LDP may be adjusted according to the rate of the micropores of the resin particles LDP. Accordingly, the density of the resin particles LDP themselves and the density of the second ink layer IKL2 formed after the resin particles LDP have been melted and cured may be different from each other. However, embodiments are not limited thereto.

Although FIGS. 11A to 11D describe that the ink layer IKL is formed after the light blocking pattern BM has been formed, embodiments are not limited thereto, and the light blocking pattern BM may be formed after the ink layer IKL has been formed so as to overlap the semi-transmission region HTA.

In the method of manufacturing the electronic apparatus according to an embodiment, the ink layer IKL having improved durability and chemical resistance as well as exhibiting excellent optical properties may be produced through a simplified process by including the resin particles LDP having a low density in the ink composition for forming the ink layer IKL. In the method of manufacturing the electronic apparatus according to an embodiment, since the resin particles LDP having a low density are included in the ink composition for forming the ink layer IKL, phase separation can be induced in a curing process, thus making it possible to form the ink layer IKL having a two-layer structure through an integrated process. Therefore, the optical properties, durability, and chemical resistance of the window WD may be improved, and the reliability of the electronic apparatus ED to which the window WD is applied may be further improved.

According to the method of manufacturing the electronic apparatus according to an embodiment, although a single printing process using a single composition may be applied, phase separation may occur due to a difference in density between constituent components, which may be advantageous in that the process may be simplified. Since the first ink layer IKL1 and the second ink layer IKL2, which are formed through an integrated process, are formed in contact with each other, excellent interfacial adhesion and mechanical properties may be exhibited. Therefore, the ink layer IKL having excellent optical properties, durability, and chemical resistance may be produced through a more simplified process.

Since the electronic apparatus according to an embodiment includes a window having improved durability and chemical resistance, the efficiency of a rework process may be increased.

In the method of manufacturing the electronic apparatus according to an embodiment, the ink layer IKL having excellent durability and chemical resistance may be produced through a more simplified process, thereby improving process reliability and productivity.

Although the above has been described with reference to embodiments, those of ordinary skill in the art will understand that various modifications and changes can be made to the embodiments. Accordingly, the technical scope should not be limited to the content described in the detailed description of the specification, but should also include all such modifications and changes.

What is claimed is:

1. An electronic apparatus comprising:
   a window including:
      a bezel region comprising a semi-transmission region and a non-transmission region surrounding the semi-transmission region; and
      a transmission region adjacent to the bezel region; and
   a display panel disposed under the window, wherein
   the window comprises:
      a base substrate;
      a light blocking pattern overlapping the non-transmission region; and
      an ink layer overlapping the semi-transmission region, and
   the ink layer comprises:
      a first ink layer disposed under the base substrate; and
      a second ink layer disposed under the first ink layer, having a density lower than that of the first ink layer, and having a light transmittance of about 90% or more in a wavelength range of about 540 nm.

2. The electronic apparatus of claim 1, wherein, with respect to a direction extending from a center of the semi-transmission region to the non-transmission region, a first width of the first ink layer in the direction and a second width of the second ink layer in the direction are same.

3. The electronic apparatus of claim 2, wherein:
the light blocking pattern includes an opening overlapping the semi-transmission region; and
a third width of the opening in the direction is smaller than the first width and the second width.

4. The electronic apparatus of claim 1, wherein:
the first ink layer comprises a first surface parallel to a plane defined by a first direction and a second direction intersecting the first direction and a first side surface extending from the first surface and parallel to a third direction intersecting the first direction and the second direction,
the second ink layer comprises a second surface parallel to the plane and facing the first surface and a second side surface extending from the second surface and parallel to the third direction, and
the first side surface and the second side surface are aligned with each other.

5. The electronic apparatus of claim 1, wherein:
the light blocking pattern includes an opening overlapping the semi-transmission region; and
the ink layer fills the opening.

6. The electronic apparatus of claim 1, wherein:
the first ink layer is in physical contact with a lower surface of the light blocking pattern; and
the second ink layer is disposed to be spaced apart from the light blocking pattern with the first ink layer interposed therebetween.

7. The electronic apparatus of claim 1, wherein the first ink layer and the second ink layer have an integral shape.

8. The electronic apparatus of claim 1, wherein the second ink layer comprises a thermosetting resin.

9. The electronic apparatus of claim 1, wherein the light transmittance of the first ink layer in a wavelength range of about 540 nm is about 10% or less.

10. The electronic apparatus of claim 1, wherein the first ink layer comprises:
a base resin; and
a dye dispersed in the base resin.

11. The electronic apparatus of claim 1, wherein the light blocking pattern comprises:
a first light blocking pattern disposed under the base substrate; and
a second light blocking pattern disposed under the first light blocking pattern.

12. The electronic apparatus of claim 11, wherein:
the first light blocking pattern includes a first opening overlapping at least the semi-transmission region,
a second opening different from the first opening is defined in the second light blocking pattern, and
the ink layer fills the first opening and the second opening.

13. The electronic apparatus of claim 1, further comprising:
an infrared detection sensor overlapping the semi-transmission region.

14. The electronic apparatus of claim 1, wherein the display panel comprises:
a base layer;
pixels disposed on the base layer and overlapping the transmission region; and
an encapsulation layer disposed on the pixels.

15. An electronic apparatus comprising:
an electronic part to output or receive a signal;
a window including:
a first region overlapping the electronic part;
a second region surrounding at least a portion of the first region; and
a third region adjacent to the second region; and
a display part disposed under the window, wherein the window comprises:
a base substrate;
a light blocking pattern including an opening overlapping at least a portion of the first region; and
an ink layer overlapping the first region and filling the opening, and the ink layer comprises:
a first ink layer disposed under the base substrate and having a first width with respect to a direction extending from a center of the opening to the second region; and
a second ink layer disposed under the first ink layer and having a second width equal to the first width with respect to the direction.

16. A method for manufacturing an electronic apparatus, the method comprising:
preparing a base substrate including a bezel region comprising a semi-transmission region and a non-transmission region surrounding the semi-transmission region, and a transmission region adjacent to the bezel region;
forming a light blocking pattern comprising an opening overlapping at least a portion of the semi-transmission region;
providing an ink composition comprising resin particles and a first ink so as to fill the opening in order to form a printing pattern;
performing a first curing of the printing pattern at a first temperature to form a preliminary ink layer; and
performing a second curing of the preliminary ink layer at a second temperature higher than the first temperature.

17. The method of claim 16, wherein a density of the resin particles is lower than a density of the first ink.

18. The method of claim 16, wherein:
the first temperature is less than a melting point of the resin particles; and
the second temperature is greater than or equal to the melting point of the resin particles.

19. The method of claim 16, wherein, in the forming of the preliminary ink layer, the resin particles are phase-separated to an upper portion of the preliminary ink layer.

20. The method of claim 16, wherein:
the resin particles comprise a thermosetting resin; and
in the performing of the second curing, the resin particles are melted and thermally cured.

* * * * *